United States Patent
Katoh et al.

(10) Patent No.: US 6,796,024 B2
(45) Date of Patent: Sep. 28, 2004

(54) METHOD FOR MAKING SEMICONDUCTOR DEVICE

(75) Inventors: Yoshitsugu Katoh, Kawasaki (JP); Mitsuo Abe, Kawasaki (JP); Yoshihiko Ikemoto, Kawasaki (JP); Sumikazu Hosoyamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/392,179

(22) Filed: Mar. 20, 2003

(65) Prior Publication Data

US 2003/0161112 A1 Aug. 28, 2003

Related U.S. Application Data

(62) Division of application No. 09/612,317, filed on Jul. 7, 2000, now Pat. No. 6,559,536.

(30) Foreign Application Priority Data

Dec. 13, 1999 (JP) .......................................... 11-353727

(51) Int. Cl.[7] ................................................ H05K 3/30
(52) U.S. Cl. ............................. 29/832; 29/840; 29/841; 29/827; 29/855; 257/712; 257/675; 361/707; 361/719
(58) Field of Search ................................. 361/707, 719, 361/736, 749; 29/832, 841, 846, 855, 827, 825, 840; 174/52.4; 257/712, 675, 706, 707, 666; 438/126, 112, 111; 385/94, 88

(56) References Cited

U.S. PATENT DOCUMENTS

| | | | |
|---|---|---|---|
| 5,147,821 A | 9/1992 | McShane et al. ...... 264/272.17 |
| 5,223,741 A | * 6/1993 | Bechtel et al. .............. 257/678 |
| 5,397,921 A | 3/1995 | Karnezos .................... 257/779 |
| 5,404,273 A | * 4/1995 | Akagawa .................... 361/707 |
| 5,420,460 A | 5/1995 | Massingill ................. 257/693 |
| 5,583,377 A | 12/1996 | Higgins, III ............... 257/706 |
| 5,692,296 A | * 12/1997 | Variot ......................... 29/827 |
| 5,843,808 A | 12/1998 | Karnezos .................... 438/121 |
| 6,230,399 B1 | * 5/2001 | Maheshwari et al. ......... 29/832 |
| 6,262,480 B1 | 7/2001 | Ferri et al. .................. 257/675 |
| 6,288,444 B1 | 9/2001 | Abe et al. .................... 257/712 |
| 6,559,536 B1 | * 5/2003 | Katoh et al. ................ 257/712 |
| 6,659,659 B1 | * 12/2003 | Malone ....................... 385/94 |

FOREIGN PATENT DOCUMENTS

| JP | 7-283336 | 10/1995 |
|---|---|---|
| JP | 8-97315 | 4/1996 |
| JP | 10-308467 | 11/1998 |
| JP | 11-251483 | 9/1999 |

* cited by examiner

*Primary Examiner*—Minh Trinh
(74) *Attorney, Agent, or Firm*—Westerman, Hattori, Daniels & Adrian, LLP

(57) ABSTRACT

According to the method of producing a semiconductor device, the substrate is provided with an opening formed at a substantially central position, interconnections and joining parts. The heat spreading plate has a fixed portion fixed to the substrate, a stage portion caved with respect to the fixed potion and connecting portions connecting the fixed portion and the stage portion. The heat spreading plate is fixed by positioning the stage portion at a position opposing the opening, then the heat spreading plate is welded to the substrate and the semiconductor chip is mounted on the stage portion through the opening. Then the semiconductor chip and interconnections formed on the substrate are electrically connected and sealing resin is formed on both sides of the heat spreading plate such that at least the semiconductor chip is sealed.

3 Claims, 26 Drawing Sheets

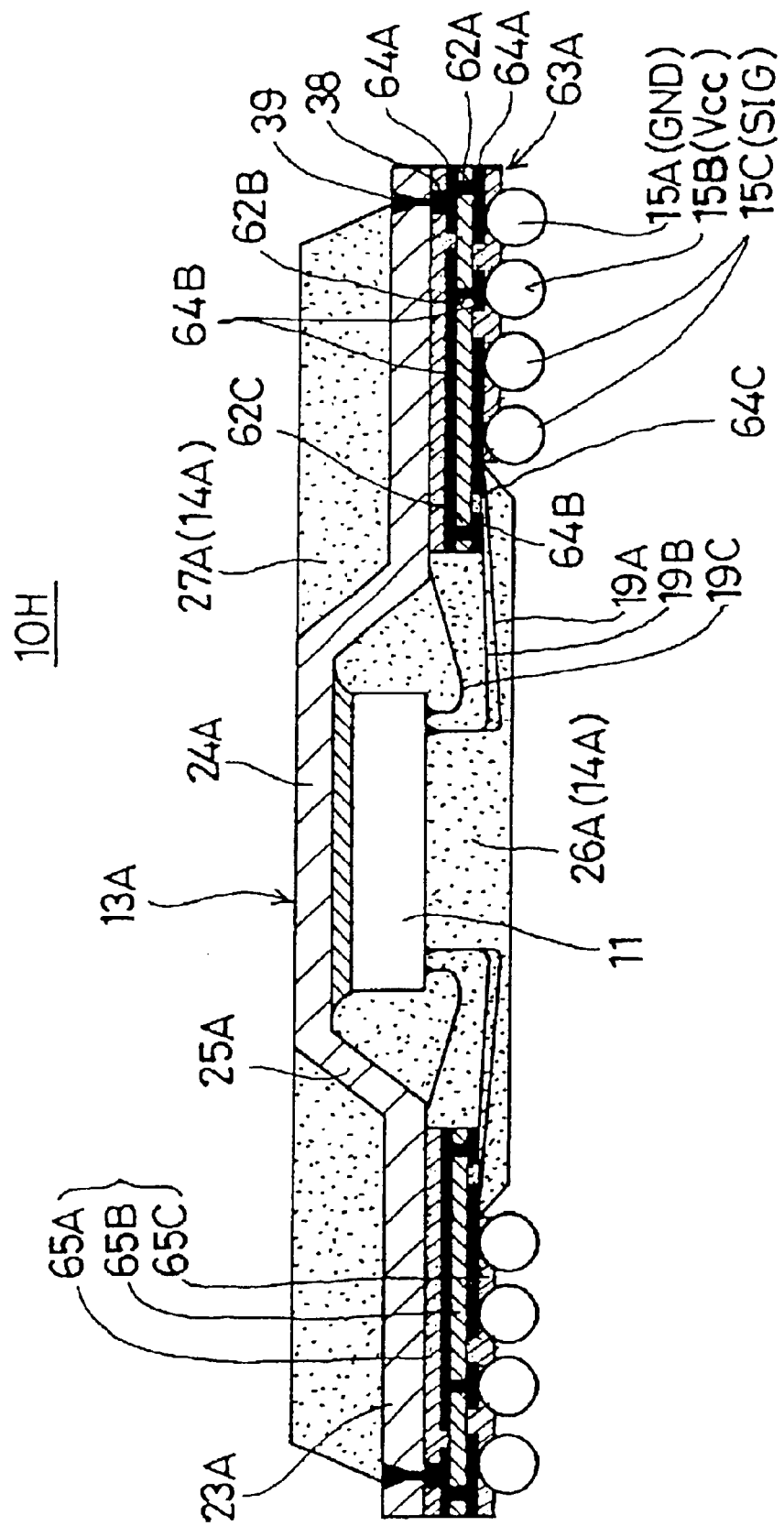

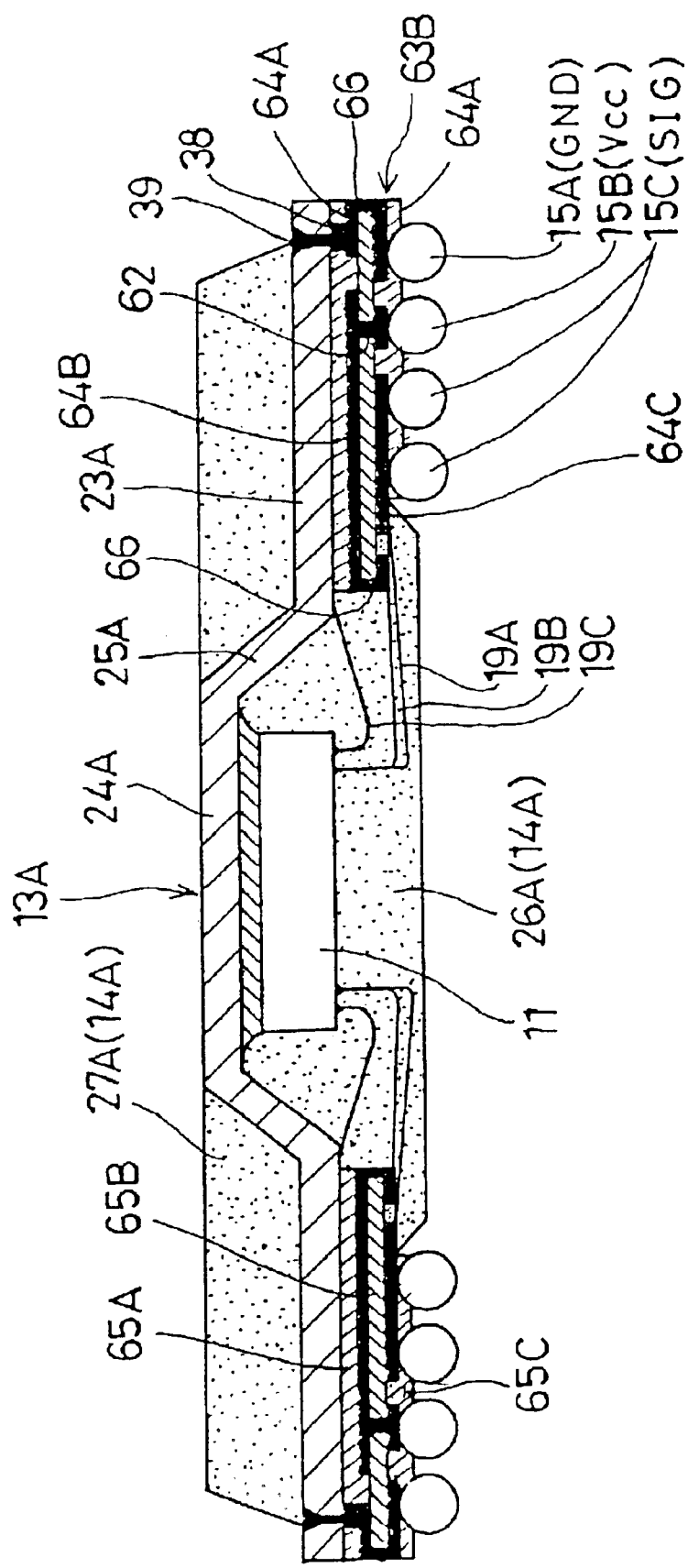

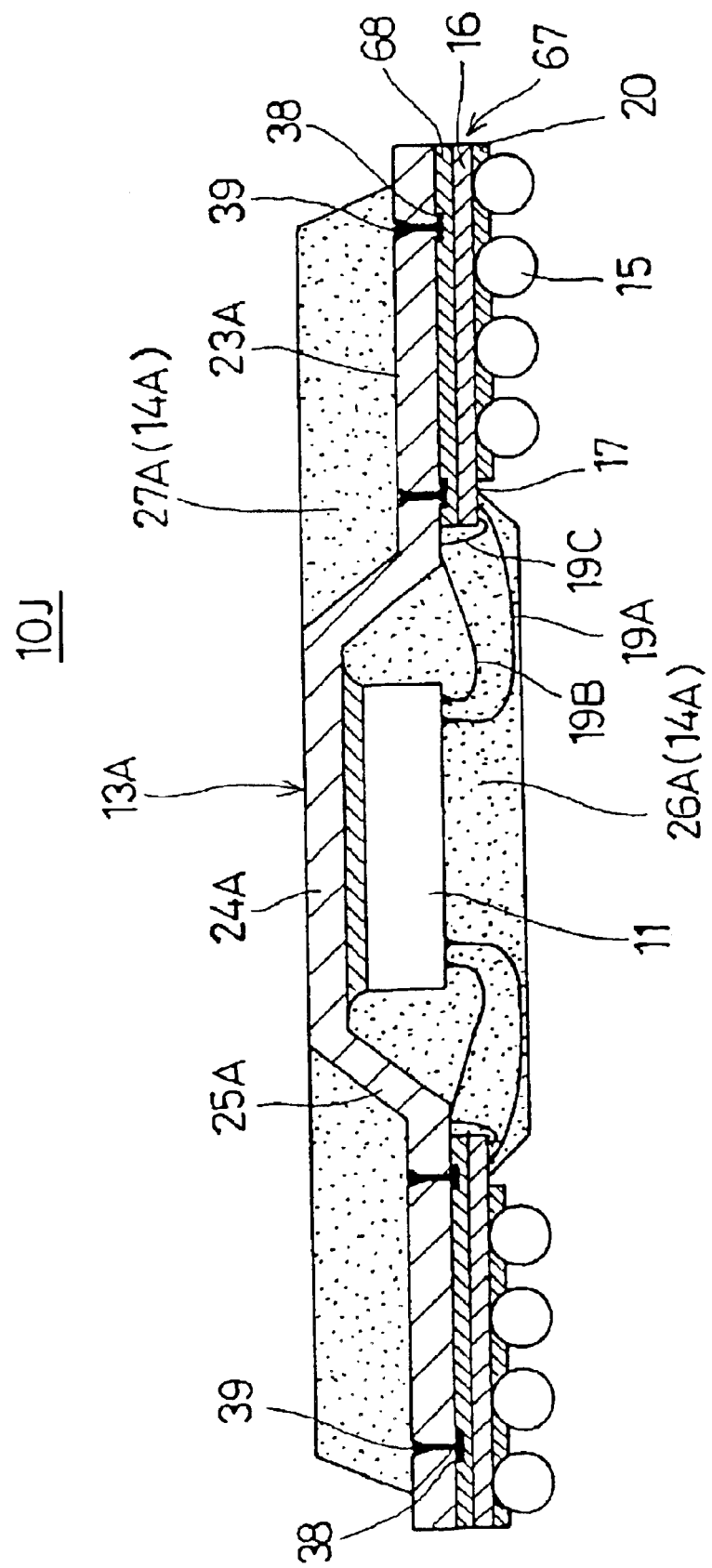

METHOD FOR MAKING SEMICONDUCTOR DEVICE

This application is a division of prior application Ser. No. 09/612,317, filed Jul. 7, 2000 now U.S. Pat. No. 6,559,536.

BACKGROUND OF THE INVENTION

1. Field of the Invention

The present invention generally relates to a semiconductor device and a method of producing the semiconductor device. More particularly, the present invention relates to a semiconductor device having a heat spreading plate for spreading heat generated in the semiconductor chip during operation.

Due to a high-density structure and increased power consumption, recent semiconductor chips tend to generate an increased amount of heat. Accordingly, the semiconductor device having a semiconductor chip thereon may be provided with a heat spreading plate for efficiently dissipating heat generated in the semiconductor chip.

In use, the semiconductor devices may be mounted on various electronic apparatuses requiring high reliability. Accordingly, a high reliability is required for the semiconductor devices.

2. Description of the Related Art

FIG. 1 illustrates a conventional fine-pitch type semiconductor device 1. This semiconductor device 1 has a package structure called FBGA (Fine-pitch Ball Grid Array). The semiconductor device 1 includes a semiconductor chip 2, a wiring board 3, solder balls 7, and a sealing resin 8.

The semiconductor chip 2 has a high density, and is fixed with an adhesive 5 onto the upper surface of the wiring board 3, which functions as an interposer. The wiring board 3 is a printed wiring board or a flexible printed board (in FIG. 1, a flexible printed board is shown). The wiring board 3 has a polyimide tape and a wiring layer 4 formed thereon. The wiring layer 4 and the semiconductor chip 2 are electrically connected by wires 6.

Openings are formed at predetermined positions of the polyimide tape, and the solder balls 7 are attached to the wiring layer 4 through the openings. Thus, the semiconductor chip 2 is electrically connected to the solder balls 7, serving as external connection terminals, via the wires 6 and the wiring layer 4.

The sealing resin 8 is molded to cover the semiconductor chip mounting surface of the wiring board 3, so as to protect the semiconductor chip 2, the wiring layer 4, and the wire 6.

As has been described above, due to a high-density structure, and increased power consumption, recent semiconductor chips tend to generate an increased amount of heat. However for the semiconductor device 1 shown in FIG. 1, the only heat transfer path for the heat generated in the semiconductor chip 2 is through the sealing resin 8 or the wiring board 3. However, the resin material used for the sealing resin 8 and the wiring board 3 is not particularly efficient with respect to the heat transfer characteristic.

Thus, the heat spreading efficiency of the semiconductor device 1 of the related art will be low, resulting in an insufficient spreading of the heat generated in the semiconductor chip. As a result, the semiconductor chip 2 is overheated, and may cause a faulty operation of the semiconductor device 1.

In order to overcome such over-heating problem, a semiconductor device having a heat spreading plate thermally connected to a semiconductor chip is known from Japanese Laid-Open Patent Application No. 7-283336. The known semiconductor device is provided with a heat spreading plate which is attached to a wiring board by an adhesive. Also, the semiconductor chip is directly mounted on the heat spreading plate which is exposed at an upper surface of the semiconductor device. The heat generated in the semiconductor chip is transferred to the heat spreading plate by direct thermal conduction and is radiated from the heat spreading plate. Thus, an efficient cooling of the semiconductor chip is achieved with the known semiconductor device.

However, with the semiconductor device having a heat spreading plate attached to the wiring board using an adhesive, the heat spreading plate may peel off from the wiring board due to aging of the adhesive. Thus, the use of an adhesive results in a drawback that the reliability of the semiconductor device is reduced.

Also, a method of producing the known semiconductor device requires a step of applying the adhesive to the heat spreading plate or to the wiring board. Since it is difficult to automate the adhesive-applying step, there is a drawback that the cost of producing the semiconductor device is increased.

SUMMARY OF THE INVENTION

Accordingly, it is a general object of the present invention to provide a semiconductor device and a method of producing the semiconductor device, which can overcome the drawbacks described above.

It is another and more specific object of the present invention to provide a semiconductor device having increased reliability.

In order to achieve the above objects according to the present invention, a semiconductor device includes:

a semiconductor chip;

a substrate electrically connected to the semiconductor chip and provided with external connection terminals on a first surface, the substrate electrically connecting the semiconductor chip and the external connection terminals; and a heat spreading plate thermally connected to the semiconductor chip, wherein the substrate is provided with joining parts made of metal on a second surface, the heat spreading plate and the substrate being joined together by welding the joining parts and the heat spreading plate.

The semiconductor device described above has an increased reliability, since the substrate and the heat spreading plate are joined without using the adhesive. There was a drawback with the semiconductor device using the adhesive in that the substrate and the heat spreading plate may peel off due to aging of the adhesive. However, with the semiconductor device of the present invention in which the substrate and the heat spreading plate are directly welded together, an aging problem can be reduced. Therefore, the substrate and the heat spreading plate are prevented from being peeled off and the reliability of the semiconductor device can be improved.

Also, since the semiconductor chip is attached to the heat spreading plate in a thermally connected manner, heat generated at the semiconductor chip can be efficiently spread and radiated. Thus, the semiconductor chip can be cooled in an efficient manner and false operation of the semiconductor device can be prevented.

It is still another object of the present invention to provide a method of producing a semiconductor device with reduced cost.

In order to achieve the above objects according to the present invention, a method of producing a semiconductor device includes the steps of:

a) forming a substrate provided with an opening formed at a substantially central position, interconnections and joining parts, one end of the interconnection being provided with an external connection terminal and the other end of the interconnection being electrically connected to a semiconductor chip;

b) forming a heat spreading plate having a fixed portion fixed to the substrate, a stage portion caved with respect to the fixed potion and connecting portions connecting the fixed portion and the stage portion;

c) fixing the heat spreading plate by positioning the stage portion at a position opposing the opening and then welding the heat spreading plate to the wiring board;

d) mounting the semiconductor chip on the stage portion through the opening;

e) electrically connecting the semiconductor chip and interconnections formed on the substrate; and f) forming sealing resin on both sides of the heat spreading plate such that at least the semiconductor chip is sealed.

With the method described above, in the heat spreading plate fixing step, the heat spreading plate is welded to the substrate. Whereas in the prior art, the heat spreading plate and the substrate are fixed by the adhesive, so that a troublesome adhesive applying step was required. The adhesive applying step results in an increase in the production cost since it is difficult to automate.

The heat spreading plate can be welded to the substrate by, for example, laser welding method which may be easily automated. Also, it does not require troublesome step such as an adhesive applying step. Accordingly, it is possible to improve production efficiency and the process of fixing the heat spreading plate and the substrate can be implemented in a simple manner at low cost.

Other objects and further features of the present invention will be apparent from the following detailed description when read in conjunction with the accompanying drawings.

BRIEF DESCRIPTION OF THE DRAWINGS

FIG. 24 is a cross-sectional diagram showing a semiconductor device of a eighth embodiment of the present invention.

FIG. 25 is a cross-sectional diagram showing a semiconductor device of a ninth embodiment of the present invention.

FIG. 26 is a cross-sectional diagram showing a semiconductor device of a tenth embodiment of the present invention.

DETAILED DESCRIPTION OF THE PREFERRED EMBODIMENTS

In the following, principles and embodiments of the present invention will be described with reference to the accompanying drawings.

Figure 2:
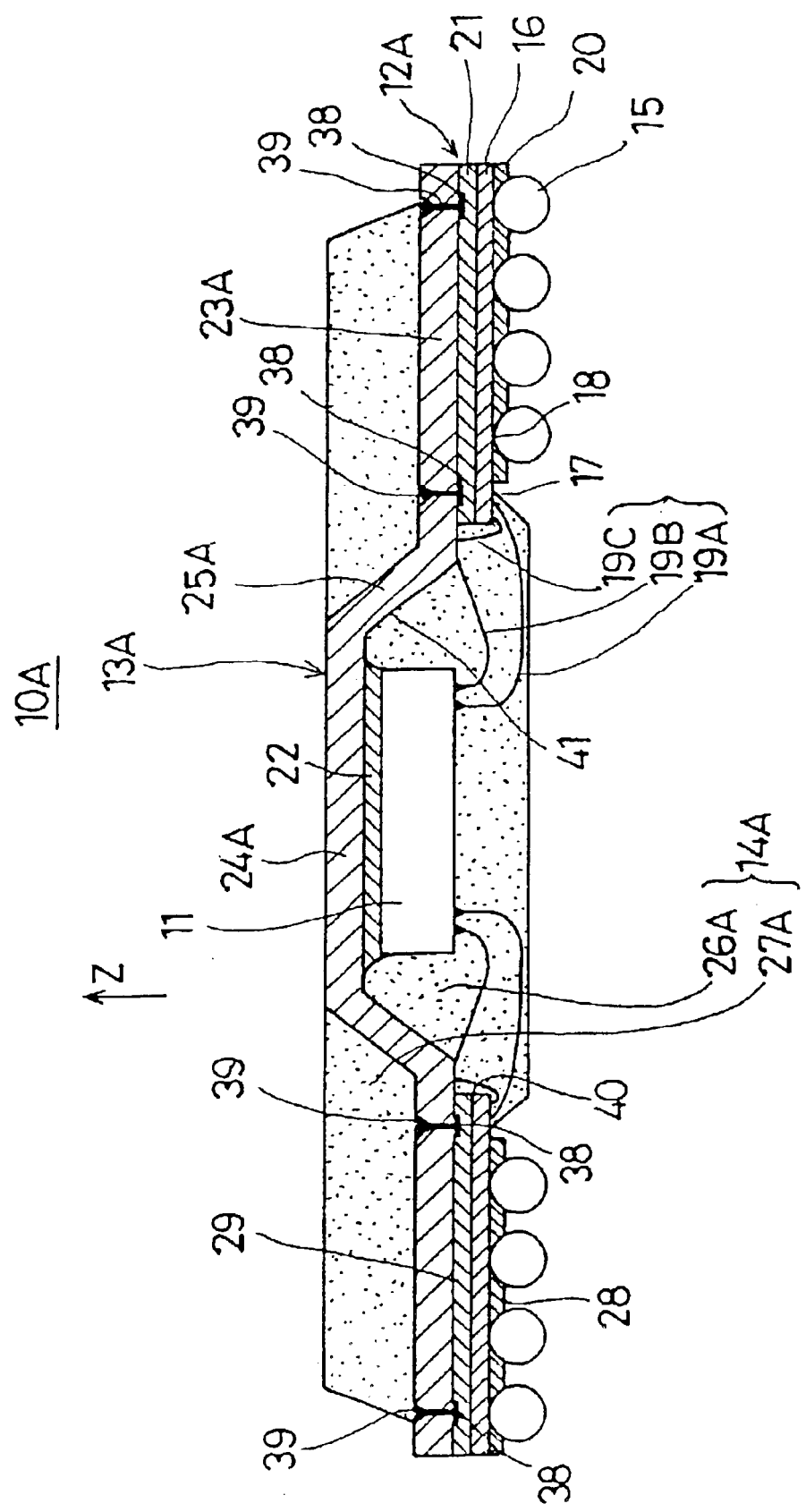
FIG. 2 is a cross-sectional diagram showing a semiconductor device of a first embodiment of the present invention.

FIG. 2 shows a semiconductor device 10A of a first embodiment of the present invention. The semiconductor device 10A comprises a semiconductor chip 11, a printed wiring board 12A, a heat spreader (heat spreading plate) 13A, a sealing resin 14A, and solder balls 15.

The semiconductor chip 11 has a high density and high power consumption. When operated, the semiconductor chip 11 generates a large amount of heat.

In this embodiment, the printed wiring board 12A is used as a substrate. The printed wiring board 12A is a glass-epoxy resin board, and a wiring layer 16 is formed on the side provided with the solder balls 15 (hereinafter referred to as a packaging surface 28). The printed wiring board 12A is provided with joining parts 38 made of metal, which are formed on the side opposite the packaging surface 28. The side provided with the joining parts 38 is hereinafter referred to as an upper surface 29.

The wiring layer 16 is made of copper (Cu), for instance, and its surface is protected by a resist 20. The solder balls 15, which serve as external connection terminals, are connected to one side of the wiring layer 16 via holes 42 (shown in FIG. 13) formed through the resist 20. Bonding pads 17, to which wires 19 to be electrically connected to the semiconductor chip 11 are bonded, are formed on the other side of the wiring layer 16.

A rectangular opening 40 is formed at the center of the printed wiring board 12A. The size of the opening 40 viewed from the top is larger than the size of the semiconductor chip 11 viewed from the top, so that the semiconductor chip 11 can be attached within the opening 40.

The heat spreader 13A functions as a heat spreading plate, and is made of a metallic material having good heat conductivity, such as copper (Cu) and aluminum (Al). Though not shown in the Figure, the heat spreader 13A is coated with a thin film of nickel (Ni). The heat spreader 13A is an integral body comprising a fixed portion 23A, a stage portion 24A, and connecting portions 25A.

Figure 4:
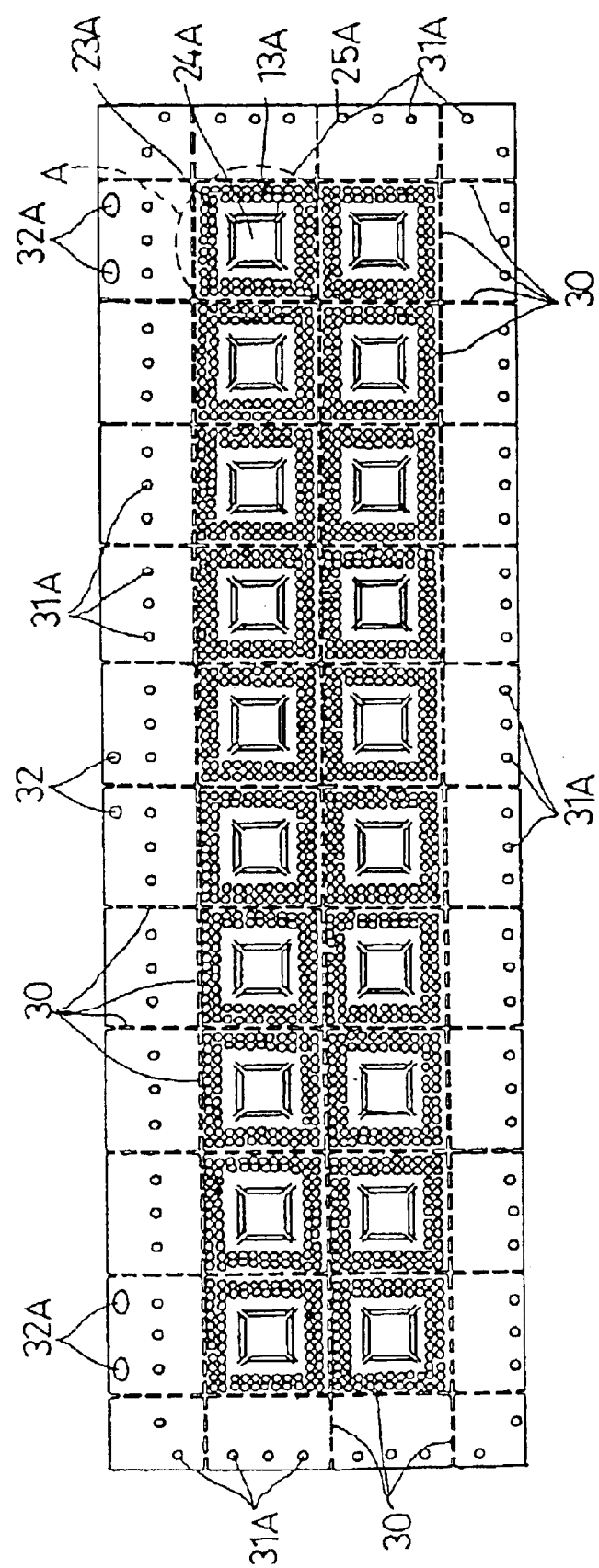
FIG. 4 is a plan view of a heat spreader collective body to be formed into a plurality of heat spreaders in a heat spreader forming step of the semiconductor device producing method.
Figure 5:
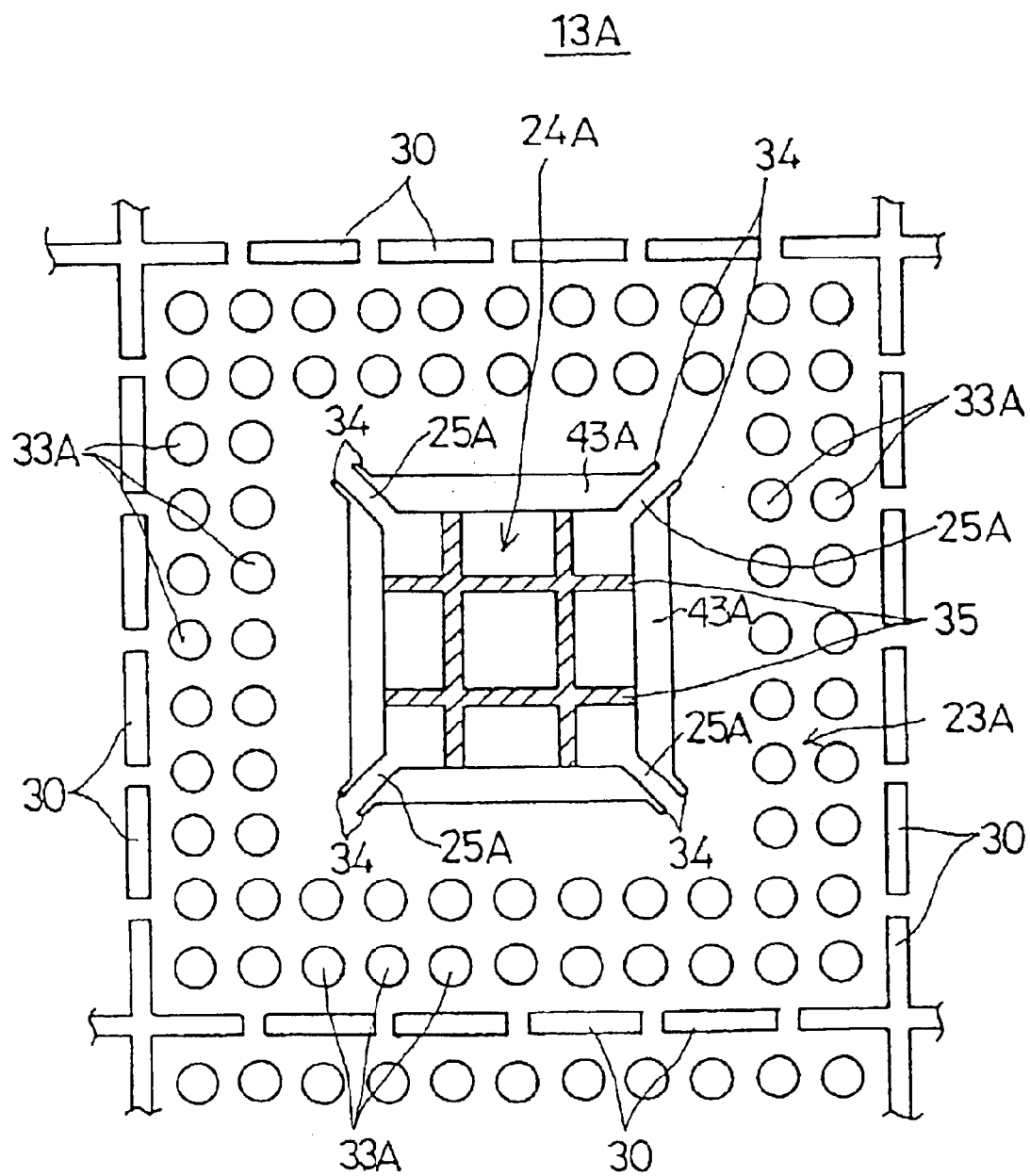
FIG. 5 is an enlarged plan view of a heat spreader collective body shown in FIG. 4.

FIG. 5 is a plan view of the heat spreader 13A. For ease of explanation, the heat spreader 13A shown in FIG. 5 is not yet separated into individual chips (FIG. 5 is an enlarged view of the region circled by a broken line A in FIG. 4).

The fixed portion 23A is fixed onto the upper surface 29 of the printed wiring board 12A and is provided with a plurality of anchor holes 33A. In this embodiment, the fixed portion 23A extends to the outer periphery of the printed wiring board 12A.

The stage portion 24A faces the opening 40 formed in the printed wiring board 12A, and is caved in the direction of arrow Z shown in FIG. 2 with respect to the fixed portion 23A. The semiconductor chip 11 is mounted onto the stage portion 24A, and a concave portion 35 is formed at the position where the semiconductor chip 11 is to be disposed, as indicated by the shaded portion in FIG. 5.

An adhesive 22 is used to bond the semiconductor chip 11 to the stage portion 24A. The adhesive 22 contains metallic powder so as to have high heat conductivity. The stage portion 24A and the semiconductor chip 11 are heat-bonded with the adhesive 22. Other types of adhesive can be used as the adhesive 22, as long as they have high thermal conductivity.

With the concave portion 35, uneven portions are formed on the semiconductor chip mounting surface of the stage portion 24A. When bonding the semiconductor chip 11 to the stage portion 24A, the adhesive 22 fills the uneven portions, so that a larger amount of adhesive can be applied. Thus, the sealing between the stage portion 24A and the semiconductor chip 11 is assured.

Although the concave portion 35 has a grid pattern in the present embodiment, the design of the concave portion 35 is not so limited. As long as the sealing between the stage portion 24A and the semiconductor chip 11 is surely maintained, the concave portion 35 may be of other shapes, such as circles and triangles.

The connecting portions 25A connect the fixed portion 23A and the stage portion 24A, and are situated between the fixed portion 23A and the four corners of the stage portion 24A. As shown in FIG. 2, the connecting portions 25A, the fixed portion 23A, and the stage portion 24A are at angles so that the stage portion 24A is caved in the direction of arrow Z with respect to the fixed portion 23A. Furthermore, the inner rims of the fixed portion 23A conform to the rim of the opening 40. Because of this, the connecting portions 25A extend out from the rim of the opening 40 formed in the printed wiring board 12A.

By caving the stage portion 24A in the direction of arrow Z with respect to the fixed portion 23A and forming the opening 40 in a position facing the stage portion 24A of the printed wiring board 12A, a space (a cavity portion 41) is formed at the center of the semiconductor device 10A. The semiconductor chip 11 is disposed in the cavity portion 41.

The sealing resin 14A comprises a first sealing resin portion 26A and a second sealing resin portion 27A. The first sealing resin portion 26A and the second sealing resin portion 27A are integrally formed through resin filling openings 43A (shown in FIG. 5) formed on the side parts of the connecting portions 25A.

The first sealing resin portion 26A is formed on the bonding side of the semiconductor chip 11 of the heat spreader 13A to protect the semiconductor chip 11 and the wires 19. The second sealing resin portion 27A is formed on the opposite surface to the bonding side of the semiconductor chip 11, and the stage portion 24A is exposed from the second sealing resin portion 27A.

In this embodiment, the solder balls 15 serve as the external connection terminals, and are electrically connected to the wiring layer 16 via the holes 42 formed through the resist 20. The solder balls 15 can be formed on the entire surface of the packaging surface 28 of the printed wiring board 12A (except the position of the opening 40), and can be formed into a grid pattern.

Because of this, a large number of solder balls 15 can be arranged on the printed wiring board 12A while maintaining relatively wide intervals between the balls. Thus, the semiconductor chip 11 having high density and a large number of terminals may be used in the present invention.

In the semiconductor device 10A having the above structure, the semiconductor chip 11 is thermally connected to the heat spreader 13A, and the stage portion 24A, to which the semiconductor chip 11 of heat spreader 13A is bonded, is exposed from the sealing resin (the second sealing resin portion 27A). With this structure, heat generated from the semiconductor chip 11 is efficiently radiated from the stage portion 24A to the outside.

With the stage portion 24A being caved in the direction of arrow Z with respect to the fixed portion 23A and the opening 40 being formed through the printed wiring board 12A, the cavity 41 is formed at the position of the semiconductor chip 11. With the semiconductor chip 11 being placed on the heat spreading plate, a part of the semiconductor chip 11 is situated inside the printed wiring board 12A.

Figure 1:
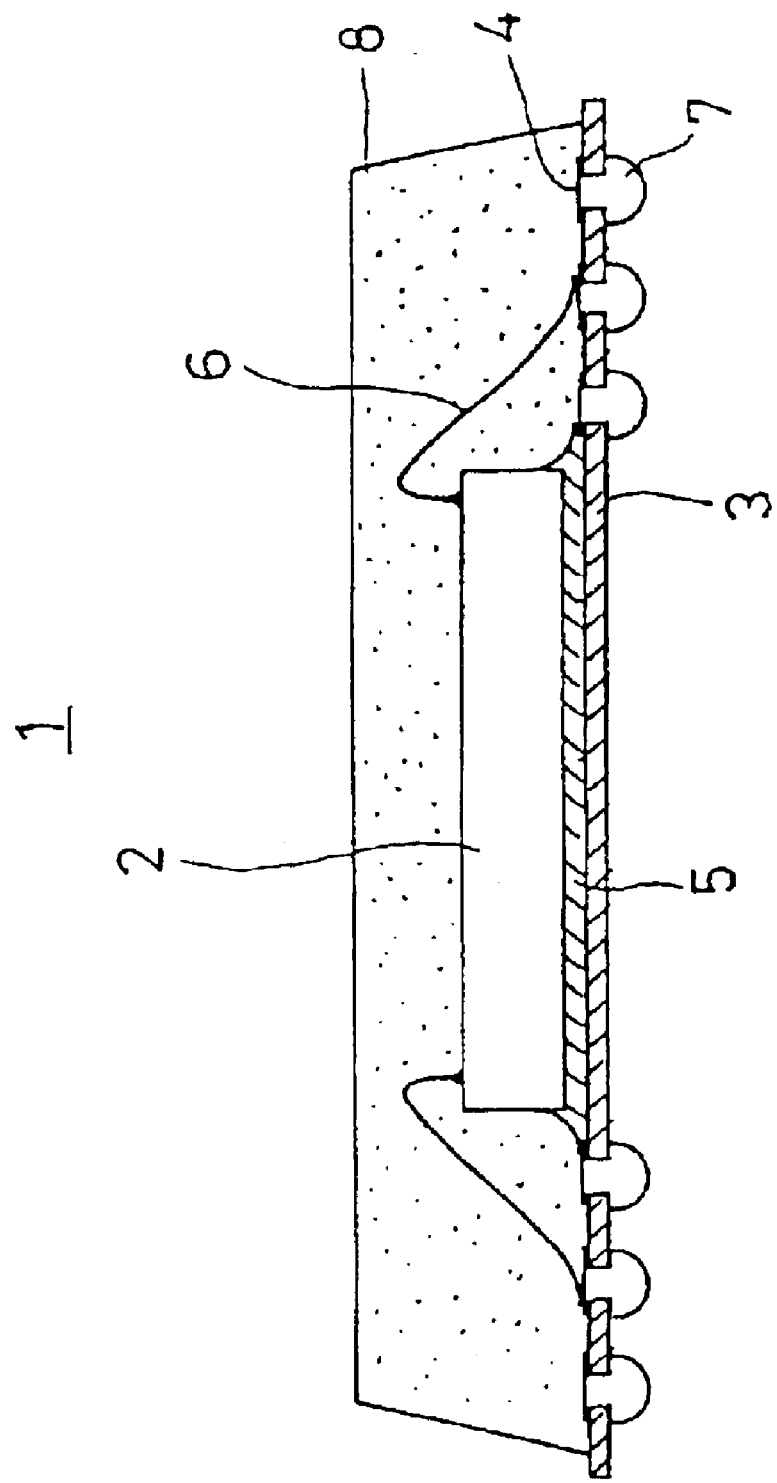
FIG. 1 is a cross-sectional diagram showing a semiconductor device of the related art.

More specifically, in this embodiment, the circuit formation surface (the surface to which the wires 19 are bonded)

of the semiconductor chip becomes level with the packaging surface 28 of the printed wiring board 12A or slightly caved from the packaging surface 28. Thus, the semiconductor device 10A can be thinner than the conventional semiconductor device 1 shown in FIG. 1 having the semiconductor chip 2 on the circuit board 3.

The sealing resin 14A comprises the first and second sealing resin portions 26A and 27A, which sandwich the heat spreader 13A. As a result, when subjected to heat, the first and second sealing resin portions 26A and 27A are thermally deformed in substantially the same manner. Thus, the heat spreader 13A (the semiconductor device 10A) can be well prevented from being deformed, compared with a structure having the sealing resin 14A only on one surface of the heat spreader 13A.

As described above, the inner rim of the fixed portion 23A conform to the rim of the opening 40, so that the connecting portions 25A extend outward from the rim of the opening formed through the printed wiring board 12A. The bonding pads 17, to which the wires 19A, 19C are bonded, are formed along the outer periphery of the opening 40 of the printed wiring board 12A. Accordingly, the fixed portion 23A of the heat spreader 13A is always situated on the side reverse to the positions of the bonding pads 17.

The fixed portion 23A of the heat spreader 13A functions as a backing board for the wire-bonding process. The fixed portion 23A can positively transmit ultrasonic vibration applied to the wires 19A, 19C and the printed wiring board 12A during the wire-bonding process, thereby maintaining good wire bonding workability.

As described above, the connecting portions 25A extend outward from the rim of the opening 40, so that the rim of the opening 40 does not face the connecting portions 25A and the stage portion 24A of the heat spreader 13A. In other words, the printed wiring board 12A does not face the connecting portions 25A and the stage portion 24A.

When wire-bonding the semiconductor chip 11 on the stage portion 24A, the printed wiring board 12A never hinders a capillary operation, thereby maintaining smooth wire bonding workability.

Further, in the present embodiment, the wire 19B electrically connects the semiconductor chip 11 and the heat spreader 13A. The wire 19C electrically connects the heat spreader 13A and the printed wiring board 12A. The wires 19B, 19C are connected to the ground interconnections of the printed wiring board 12A and to the ground terminals of the semiconductor chip 11.

Accordingly, the heat spreader 13A is grounded via the wires 19B, 19C. Thus, the heat spreader 13A has a shield function for preventing electromagnetic disturbances from entering the semiconductor chip 11 while having a heat spreading function for spreading the heat generated at the semiconductor chip 11. Therefore, the reliability of the operation of the semiconductor chip 11 can be increased.

Now, an explanation is made as to how the printed wiring board 12A and the heat spreader 13A are fixed to each other.

In the present embodiment, the joining parts 38 are formed on the upper surface of the printed wiring board 12A. The printed wiring board 12A and the heat spreader 13A are connected by welding the joining part 38 and the heat spreader 13A. The welding process employed in the present embodiment is a laser welding process. As a result of the welding process, welding parts 39 are formed in the fixed portion 23A of the heat spreader 13A, and the welding parts 39 and the joining parts 38 will be connected in an integrated manner.

As has been described above, when the printed wiring board and the heat spreader are fixed using the adhesive, the reliability of the semiconductor device will decrease due to the aging of the adhesive. However, in the present embodiment, the printed wiring board 12A and the heat spreader 13A are welded together, so that a possibility of occurrence of the degradation due to aging can be significantly reduced compared to the semiconductor device using the adhesive.

In other words, since an alloy is formed between the joining parts 38 and the heat spreader 13A consisting of the molten metal of the joining parts 38 and molten metal of the heat spreader 13A, the joining parts 38 and the heat spreader 13A will become an integrated structure. Therefore, there will be practically no degradation due to aging at the welding parts, so that the peeling off between the printed wiring board 12 and the spreader 13A can be prevented positively. Accordingly, the reliability of the semiconductor device 10A is improved.

The following is a description of the method of producing the semiconductor device 10A of the first embodiment, with reference to FIGS. 3 to 13. The following description relates to a method of producing the semiconductor device 10A described with reference to FIG. 2.

Figure 3:
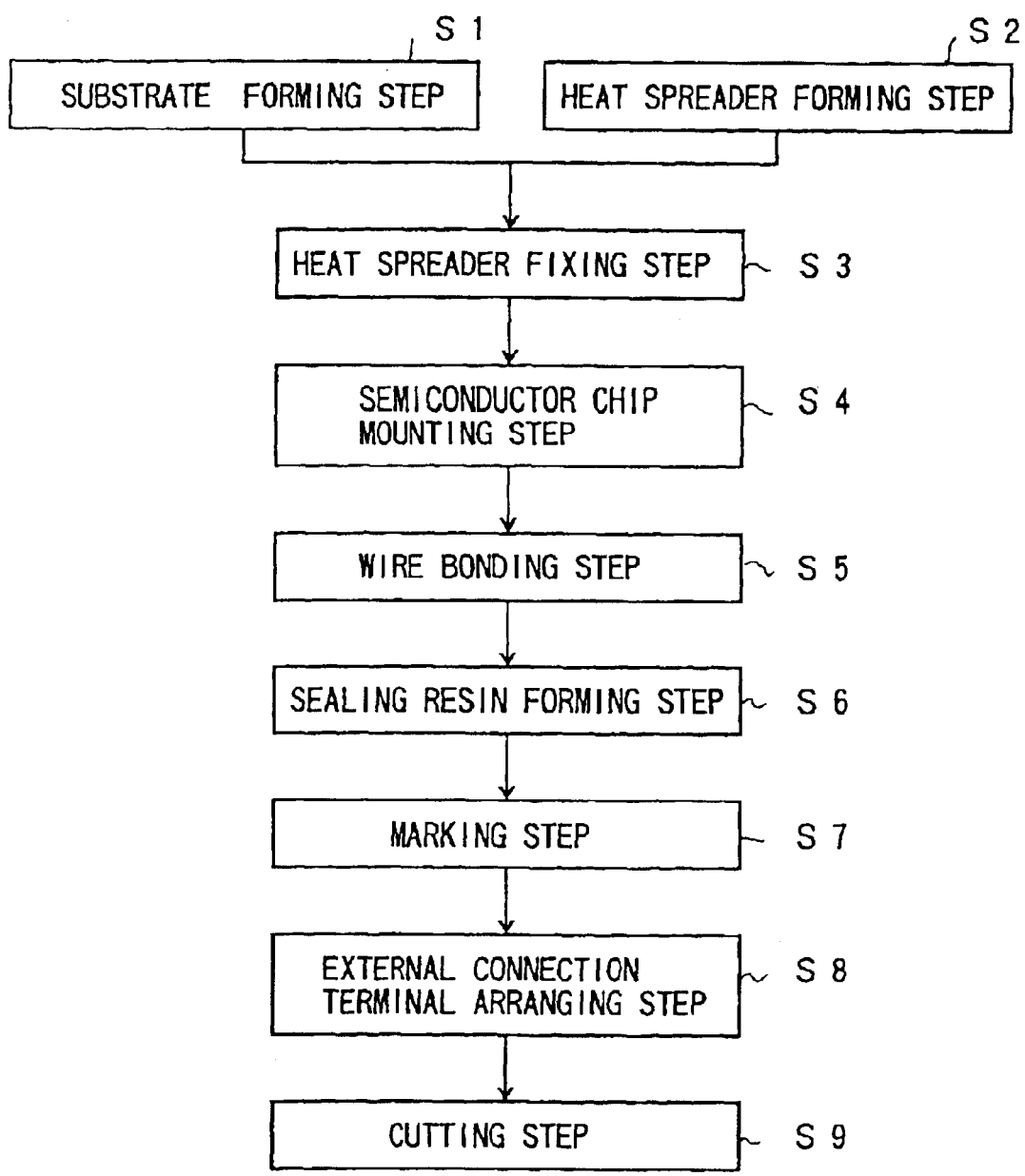
FIG. 3 is a flowchart showing a method of producing the semiconductor device of the first embodiment of the present invention.

FIG. 3 is a flowchart of the method of producing the semiconductor device 10A. As shown in FIG. 3, the method of producing the semiconductor device 10A comprises a substrate forming step (step 1: "step" will be hereinafter referred to as "S"), a heat spreader forming step (S2), a heat spreader fixing step (S3), a semiconductor chip mounting step (S4), a wire bonding step (S5), a sealing resin forming step (S6), a marking step (S7), an external connection terminal arranging step (S8), and a cutting step (S9).

The substrate forming step (S1) is a step of forming the printed wiring board 12A. In this step, the wiring layer 16 having junction electrodes 18 (shown in FIG. 8) to which the solder balls 15 are attached are formed on a lower surface of a glass-epoxy resin base material 44A (shown in FIG. 10) by a plating method and an etching method. Further, in order to protect the wiring layer 16, a resist material 20 is provided on the lower surface of the resin base material 44A except at the junction electrodes 18 and the bonding pads 17.

On an upper surface of the base material 44A, the joining parts 38 are formed by plating method and etching method. The joining part 38 has a laminated structure of a copper layer 38C (thickness of approximately 12 $\mu$m), a nickel layer 38B (thickness of approximately 3 $\mu$m), and a gold layer 38A (thickness of approximately 1 $\mu$m). After the joining parts 38 have been formed, a resist layer 44B is formed on the upper surface of the resin base material 44A except for positions corresponding to the joining parts 38.

The opening 40, through which the semiconductor chip 11 is attached, is formed at the center of the printed wiring board 12A. The opening 40 is formed by stamping. The stamping can be carried out before or after formation of the wiring layer 16 and the joining parts 38.

In this embodiment, a so-called multi-cavity molding is performed to form a plurality of printed wiring boards 12A from a single base material. More specifically, twenty printed wiring boards 12A are formed from one base material.

Figure 8:
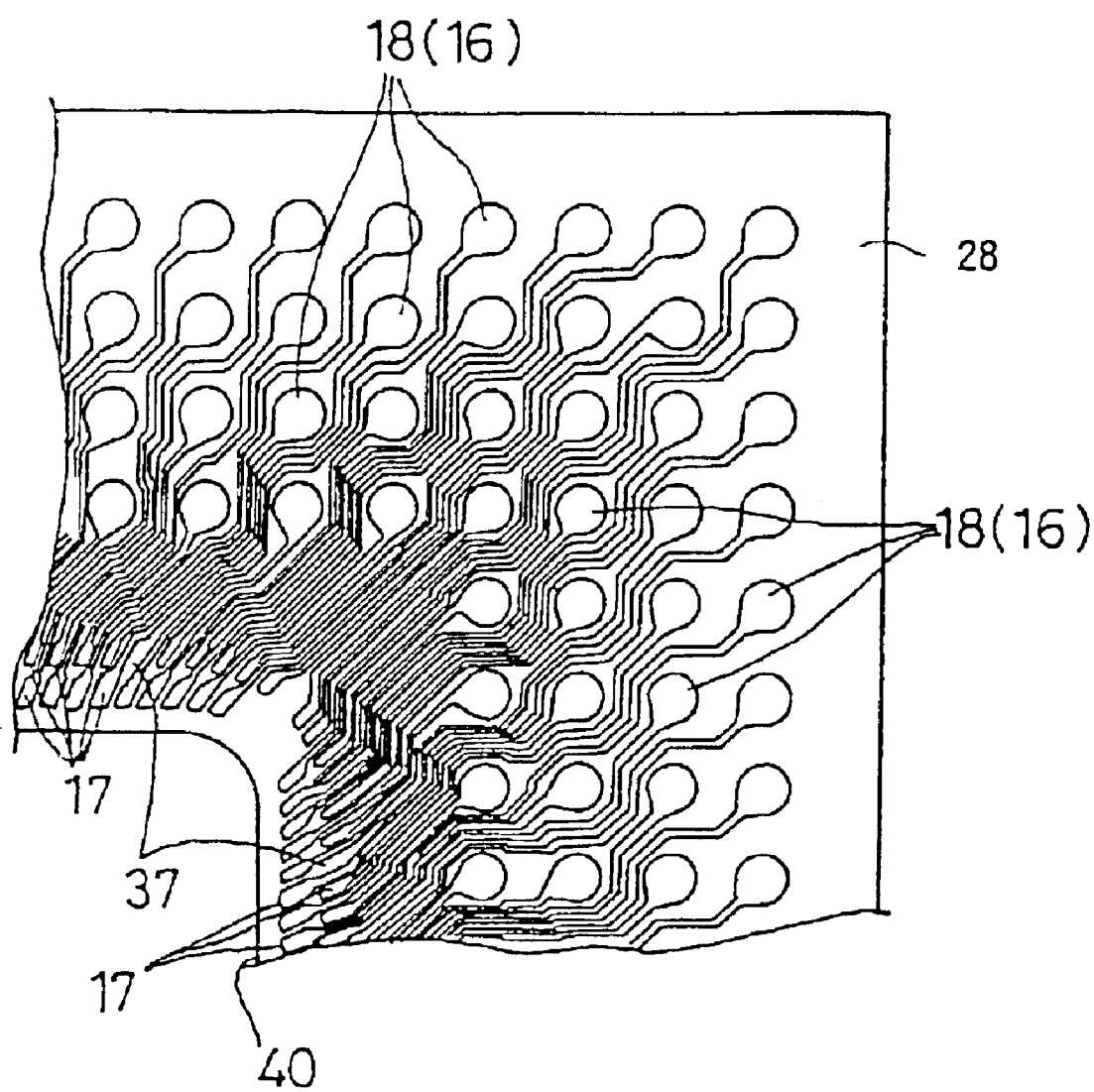
FIG. 8 is a partial plan view of a printed wiring board illustrating the substrate forming step of the semiconductor device producing method of the present invention.
Figure 9:
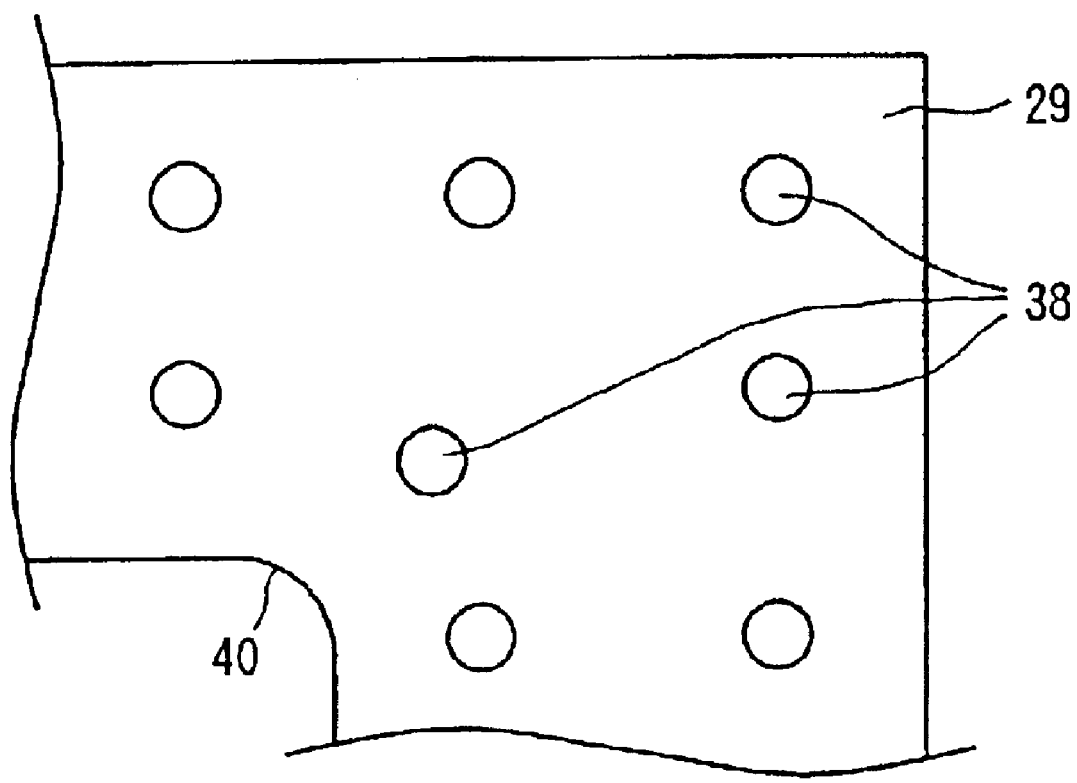
FIG. 9 is a partial plan view of a variant of a printed wiring board illustrating the substrate forming step of the semiconductor device producing method of the present invention.

FIGS. 8 and 9 are partially enlarged views of the printed wiring boards 12A formed in the substrate forming step (S1). FIG. 8 shows the packaging side 28 of the printed wiring board 12A and FIG. 9 shows the upper side 29 of the printed wiring board 12A.

As shown in FIG. 8, in the present embodiment, in the substrate forming step (S1), the bonding pads 17 are arranged in a staggered pattern, and gap portions 37 are also intermittently formed in the bonding pad formation area.

Along with an increase in the number of terminals of the semiconductor chip 11, the number of bonding pads formed on the printed wiring board 12A also becomes larger. To make the semiconductor device 10A compact, the area in which the bonding pads 17 are formed needs to be small. In view of this, the bonding pads 17 are arranged in a staggered pattern so as to make the bonding pad formation area small.

If the bonding pads 17 are arranged too close to each other, crossings might occur between adjacent wires 19 when the wires 19 are bonded to the bonding pads 17. To prevent this, the gap portions 37 are formed intermittently in the bonding pad formation area. At the gap portions 37, the wire bonding positions in the gap portions 37 are reversed, thereby allowing more space for the wires 19. Thus, crossings of the wires 19 can be avoided.

As shown in FIG. 9, a plurality of joining parts 38 are exposed at the upper side 29 of the printed wiring board 12A. The position and size (area) of the joining part 38 is determined such that a joining force sufficient for preventing any peeling is obtained when the heat spreader 13A and the printed wiring board 12A are joined together. Also, the joining parts 38 are provided at positions where the wiring layer 16 is not provided, since the joining parts 38 are subjected to laser welding.

The heat spreader forming step (S2) is a step of forming the heat spreader 13A. In this step, etching, stamping and plating is carried out on a base material, such as a copper plate or an aluminum plate having good heat conductivity, to form the heat spreader 31A.

FIG. 4 shows a heat spreader collective body 13 formed in the heat spreader forming step. As shown in FIG. 4, multi-cavity molding is performed in this embodiment, and one heat spreader collective body 13 includes twenty heat spreaders 13A.

In the following description, each heat generating plate disposed in the semiconductor device 10A is referred to as the heat spreader 13A, and heat generating plates connected to each other (as shown in FIG. 4) are referred to as the heat spreader collective body 13.

As shown in FIG. 4, the heat spreader collective body 13 is surrounded by outer periphery anchor holes 31A on the outer periphery of the heat spreader 13. Cutting slits are also formed in a grid pattern. Positioning holes 32A are formed at predetermined positions of the heat spreader collective body 13. The stage portion 24A is formed in the center of each heat spreader 13A. The stage portion 24A is caved with respect to the fixed portion 23.

The outer periphery anchor holes 31A improve the bonding between the sealing resin 14A and the heat spreader collective body 13 in the sealing resin forming step (S6). The cutting slits 30 are formed along the cutting positions of a blade used in cutting the semiconductor device 10A in the cutting step (S9).

Furthermore, the positioning holes 32A position the printed wiring board 12A with respect to the heat spreader collective body 13, and metal molds 45 and 46 (shown in FIG. 11) with respect to the heat spreader 13, in the heat spreader fixing step (S3) and the sealing resin forming step (S6).

In this embodiment, the outer periphery anchor holes 31A are circular viewed from the top, and the cutting slits 30 are narrow rectangular viewed from the top. However, the outer periphery anchor holes 31A and the cutting slits 30 may have other shapes.

FIG. 5 shows one of the heat spreaders 13A in the heat spreader collective body 13. Each heat spreader 13A comprises a fixed portion 23A, a stage portion 24A, connecting portions 25A, cutting slits 30, anchor holes 33A, slits 34, and resin filling openings 43A. The fixed portion 23A, the stage portion 24A, the connecting portions 25A, the cutting slits 30, and the resin filling openings 43A have already been explained in the foregoing description.

In this embodiment, each of the anchor holes 33A is a through-hole having a circular shape (of, for example, 0.15 mm diameter) viewed from the top. Eighty anchor holes 33A are formed at the fixed portion 23A, surrounding the stage portion 24A. Each of the heat spreaders 13A is bonded to one printed wiring board 12A, and in the bonded condition, anchor grooves or anchor holes (not shown) face the anchor holes 33A of the printed wiring board 12A.

The slits 34 are formed at the bonding positions between the fixed portion 23A and the connecting portions 25A. Each slit 34 is U-shaped, and 0.15 mm in width and 0.50 mm in length. By forming the slits 34 in the bonding positions between the fixed portion 23A and the connecting portions 25A, unwanted deformation and distortion can be avoided when stamping the stage portion 24A with respect to the fixed portion 23A.

When stamping the stage portion 24A, stress is applied to the bonding positions between the fixed portion 23A and the connecting portions 25A, which are the folded portions. If a mechanism for releasing the stress is not employed, deformation and distortion are caused by the stress at the bonding positions.

In this embodiment, the slits 34 formed in the stress applied positions become deformed to absorb the applied stress. Thus, unwanted deformation or distortion is not caused to the fixed portion 23A, the stage portion 24A, and the connecting portions 25A. Although the slits 34 are formed at the bonding positions between the connecting portions 25A and the fixed portion 23A in this embodiment, the slits 34 may be formed at the bonding positions between the stage portion 24A and the connecting portions 25A.

Figure 6:
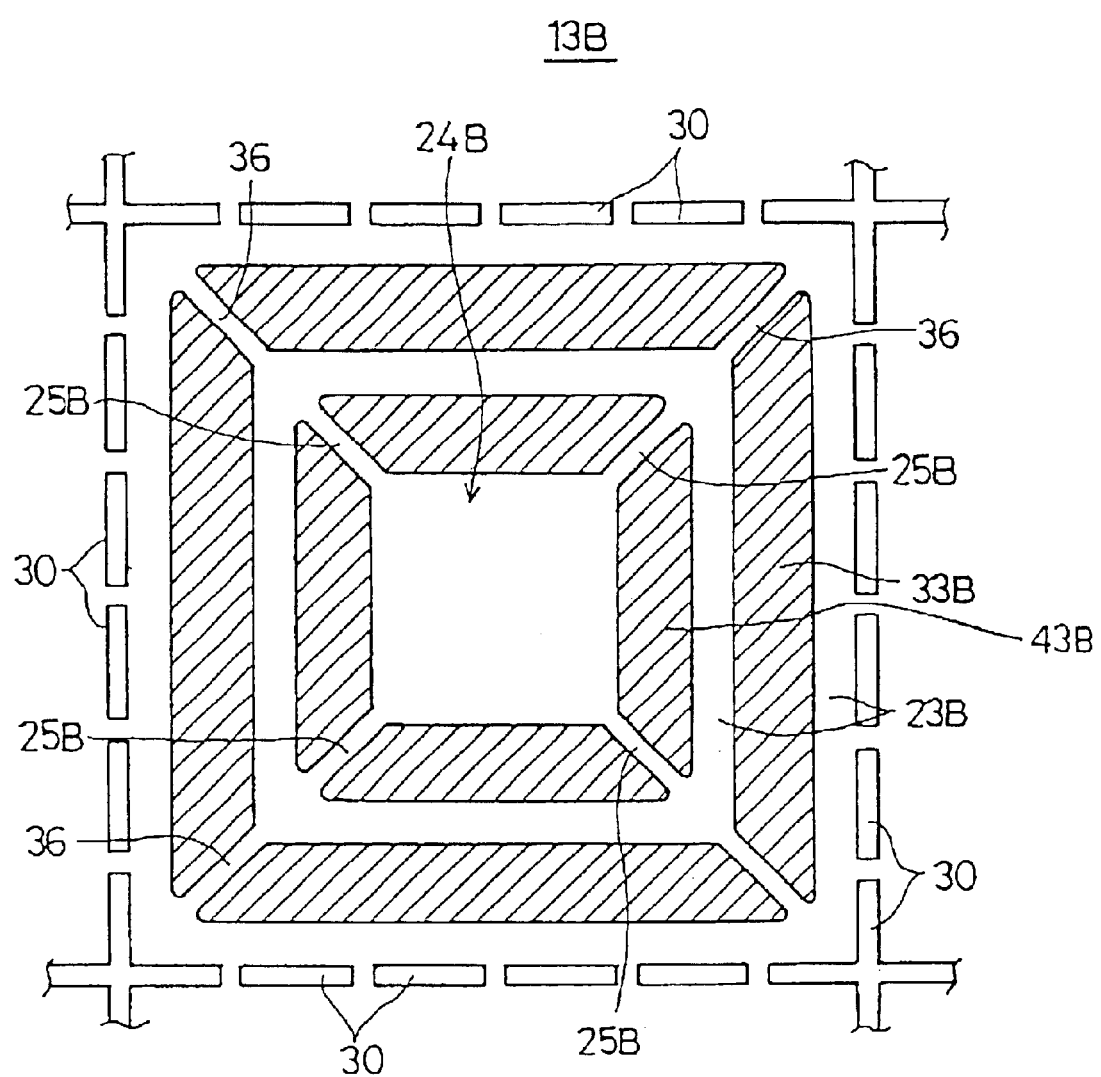
FIG. 6 is an enlarged plan view of a variant of a heat spreader collective body shown in FIG. 4.
Figure 7:
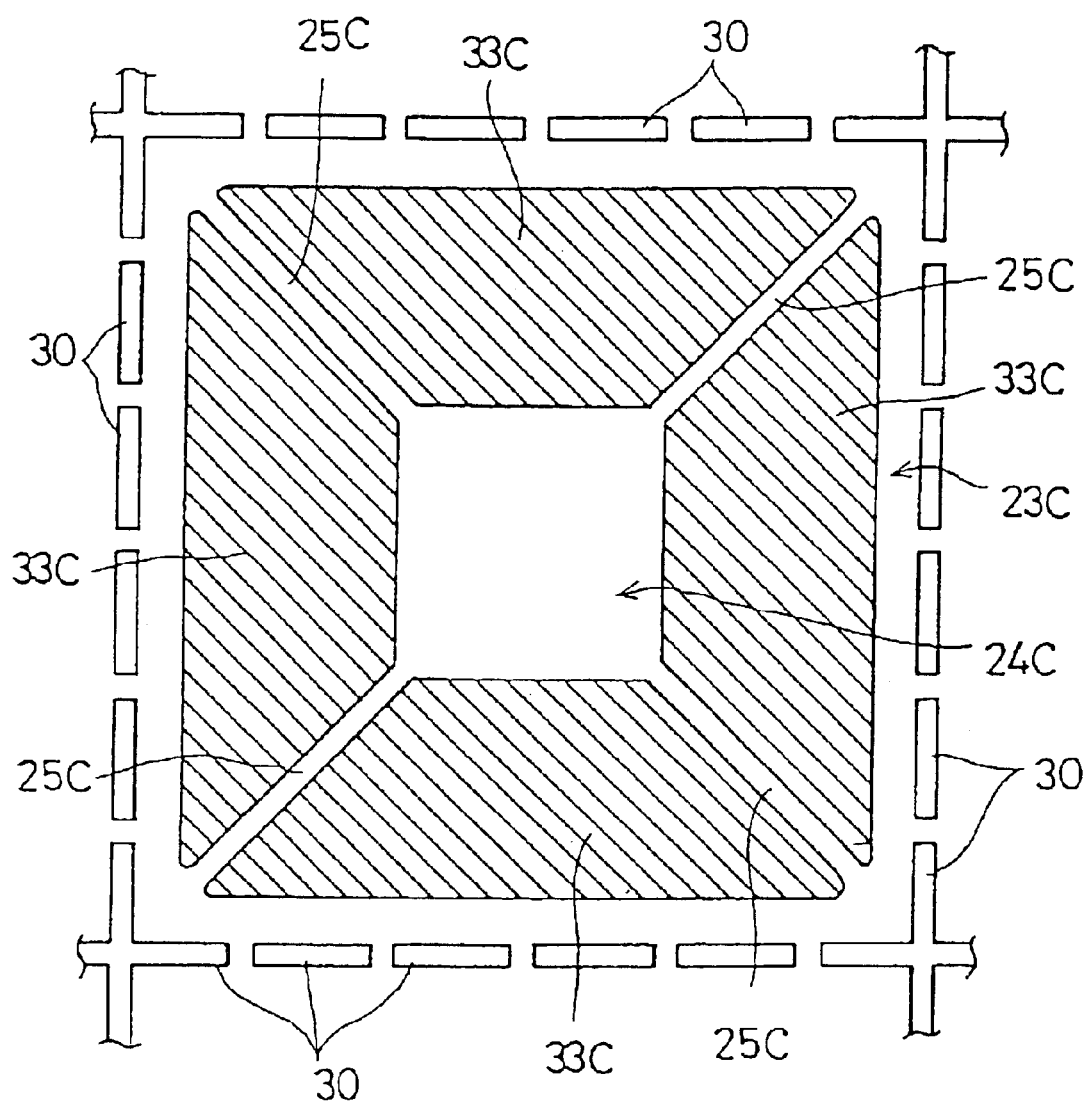
FIG. 7 is an enlarged plan view of another variant of a heat spreader collective body shown in FIG. 4.

FIGS. 6 and 7 illustrates heat spreaders 13B and 13C which are modifications of the heat spreader 13A shown in FIG. 5.

The heat spreader 13B of FIG. 6 is characterized by rectangular anchor holes 33B. The anchor holes 33A in the heat spreader 13A of FIG. 5 are circular, but the anchor holes 33A may have rectangular shapes as shown in FIG. 6 or other shapes.

The heat spreader 13C of FIG. 7 has connecting portions 25C which are smaller in area. By making the areas of the connecting portions 25C smaller, anchor holes 33C can also function as the resin filling openings. Accordingly, the anchor holes 33C can improve the bonding with the printed wiring board 12A, and as the resin filling openings, the anchor holes 33C can improve the performance in filling the sealing resin 14A in the sealing resin forming step.

The substrate forming step (S1) and the heat spreader forming step (S2) can be carried out at the same time as separate steps. The two steps may be carried out in any order.

Figure 10:
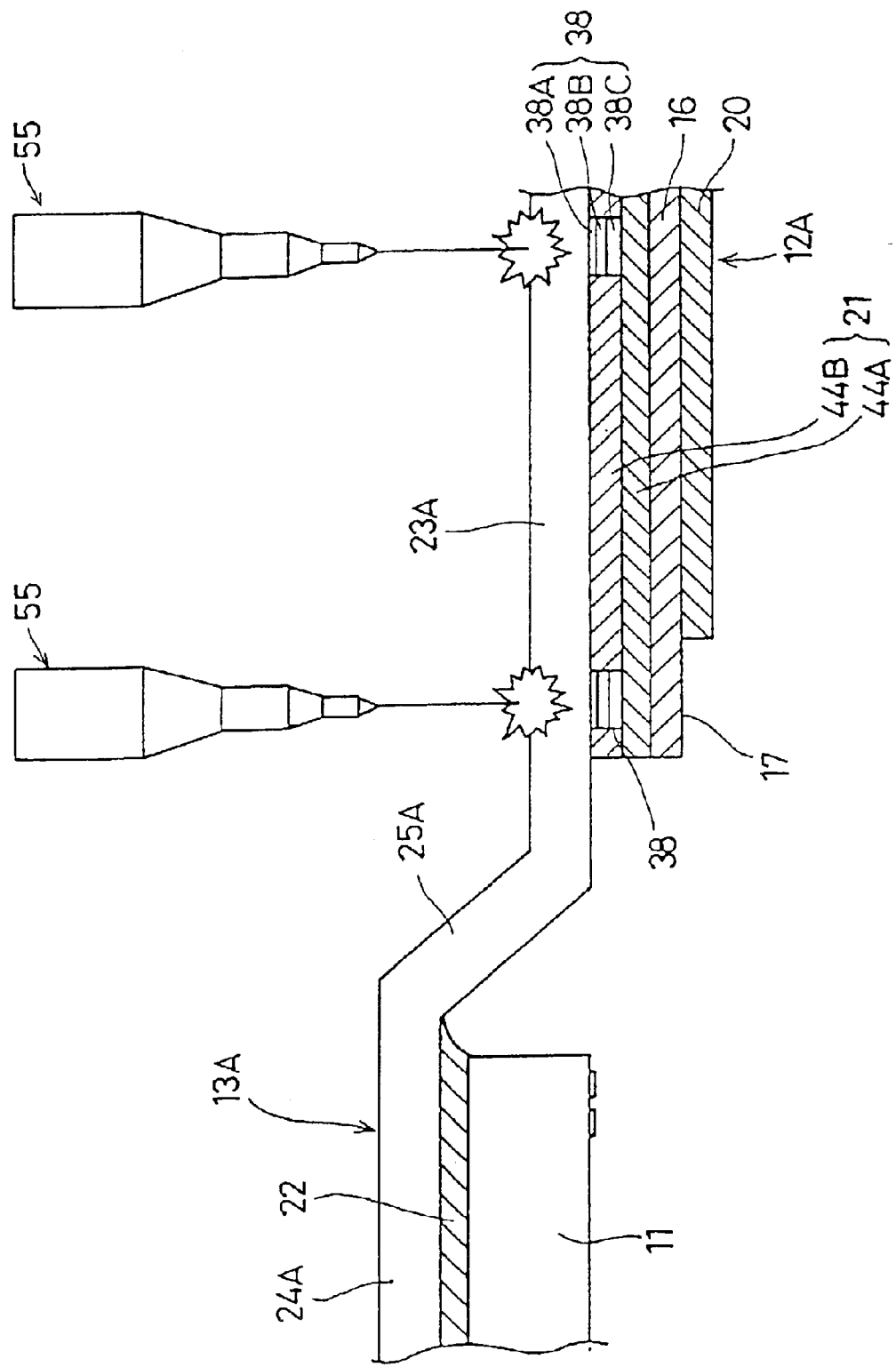
FIG. 10 is a schematic partial cross-sectional view of the semiconductor device shown with the laser welding apparatus illustrating a heat spreader fixing step of the semiconductor device producing method of the present invention.
Figure 11:
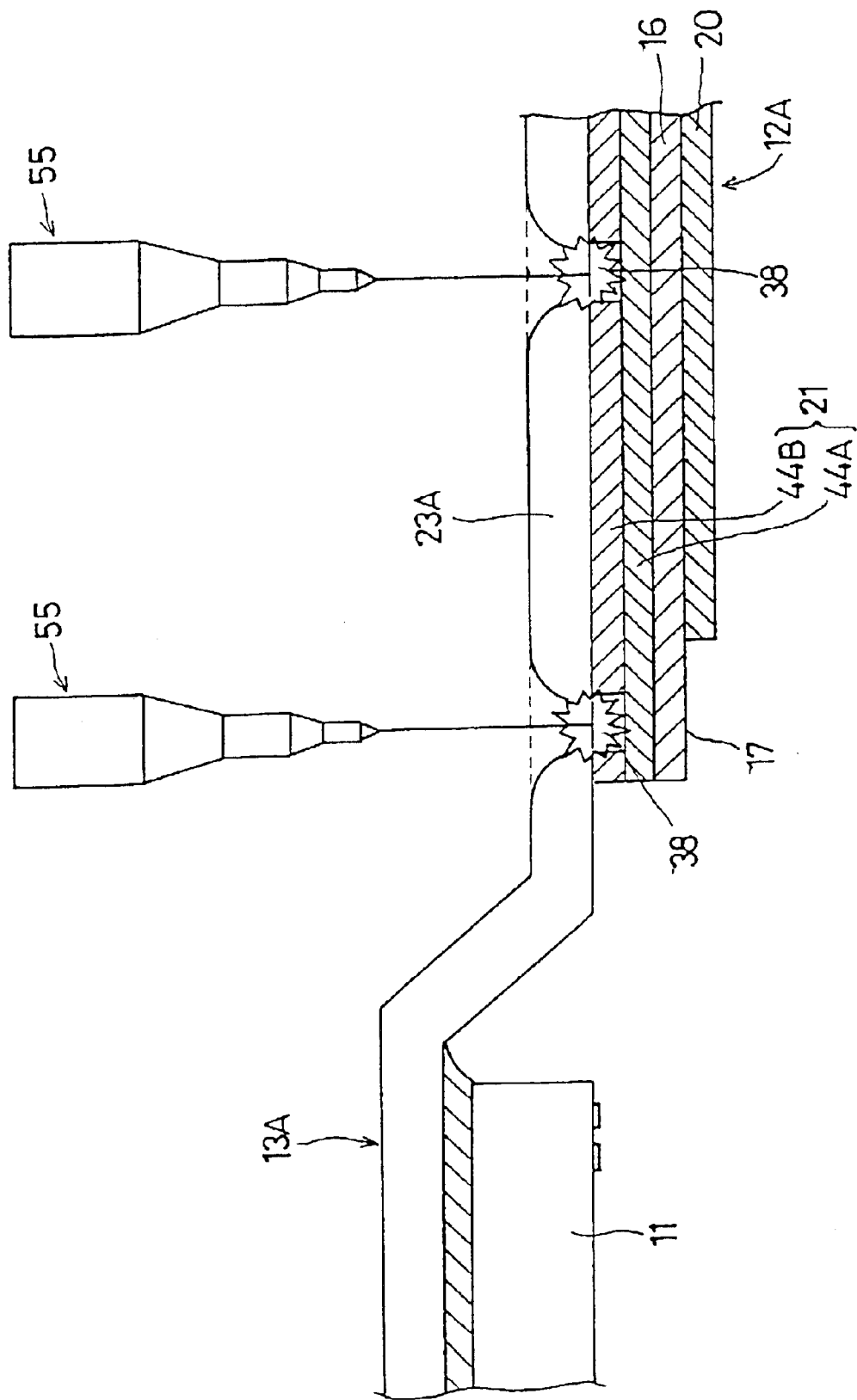
FIG. 11 is another schematic partial cross-sectional view of the semiconductor device shown with the laser welding apparatus illustrating a heat spreader fixing step of the semiconductor device producing method of the present invention.
Figure 12:
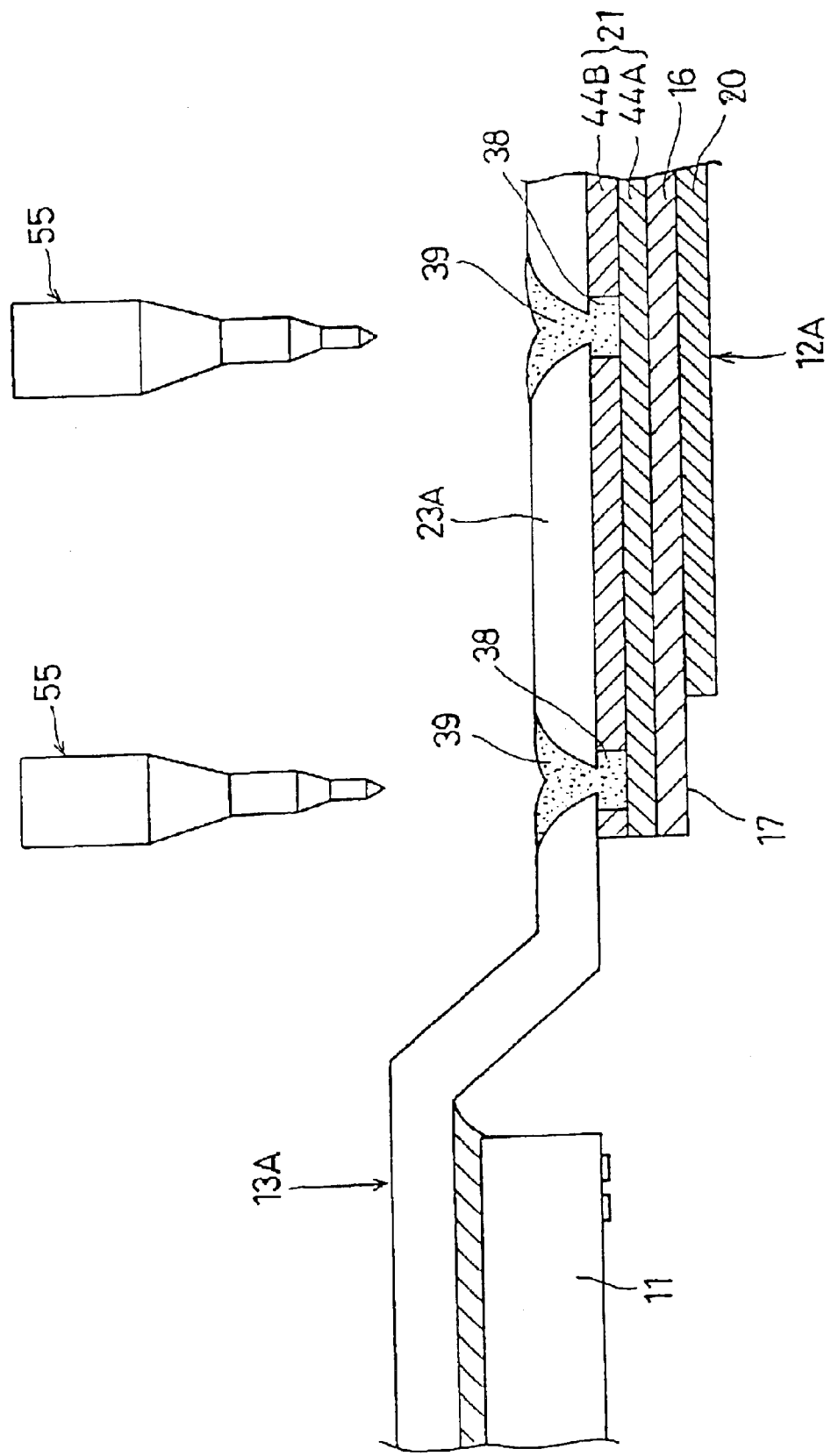
FIG. 12 is still another schematic partial cross-sectional view of the semiconductor device shown with the laser welding apparatus illustrating a heat spreader fixing step of the semiconductor device producing method of the present invention.

The substrate forming step (S1) and the heat spreader forming step (S2) are followed by the heat spreader fixing step (S3). In this step, the heat spreader 13 (13A) is fixed to the printed wiring board 12A. FIGS. 10 to 12 are detailed diagrams of the heat spreader fixing step.

In the heat spreader fixing step, the stage portion 24A of the heat spreader 13A is positioned against the printed wiring board 12A using the positioning holes 32, so as to face the opening 40 formed in the printed wiring board 12A. Then, thus-positioned printed wiring board 12A and the heat spreader 13A are mounted on the laser welding apparatus 55 (in the figure, only a laser irradiation unit of the laser welding apparatus 44 is shown). The heat spreader 13A is mounted in such a manner that the heat spreader 13A opposes the laser welding apparatus 55 and that the laser beam irradiation positions oppose the joining parts 38.

After the above-described positioning process, the laser welding apparatus 55 starts irradiating a laser beam towards the heat spreader 13A. FIG. 10 shows a state immediately after starting irradiation of the laser beam by the laser welding apparatus 55. By irradiating the laser beam towards the heat spreader 13A, the heat spreader 13A will melt at irradiated positions.

Further, as the laser beam welding process of the heat spreader 13A proceeds, the laser beam will penetrate through the heat spreader 13A and reaches the joining parts 38 formed in the printed wiring board 12A as shown in FIG. 11. Then, the laser beam also melts a part of the joining parts 38. The laser welding apparatus 55 is controlled with regards to its irradiation timing such that irradiation is terminated when the laser beam reaches the joining parts 38 and a part of the joining parts 38 is melted. Thus, the laser beam will not reach the base material 44A of the printed wiring board 12A.

FIG. 12 shows a state where the laser beam irradiation process by the laser welding apparatus 55 has been completed. When the laser beam irradiation is ceased, the molten metal of the heat spreader 13A and the joining parts 38 enters the hole formed by laser irradiation and forms a welding part 39. The welding part 39 and the molten metal of the joining parts 38 form an alloy. Accordingly, the gold welding part 39 and the joining part 38 become an integrated structure. A greater joining strength and less aging is obtained between the gold welding part 39 and the joining part 38 integrated by welding compared to the related art structure using the adhesive. Thereby, printed wiring board 12A and the heat spreader 13A can be prevented from peeling off from each other, so that the reliability of the semiconductor device 10A can be improved.

Also, an advantage of fixing the heat spreader 13A to the printed wiring board 12 by laser welding is that the fixing process can be implemented in a simple manner at a low cost.

In the semiconductor device producing method of the related art in which the printed wiring board and the heat spreader are fixed by the adhesive, the adhesive applying step is troublesome and is difficult to automate. Therefore, the producing cost is increased. However, in the present embodiment, the printed wiring board 12A and the heat spreader 13A are welded by the laser beam and thus can be automated. The production efficiency can be improved, since it is not necessary to implement a troublesome adhesive-applying step. Accordingly, with the laser welding process of the present embodiment, the step of fixing the heat spreader 13A and the printed wiring board 12A can be implemented with an improved efficiency and a low cost.

In the present embodiment, the printed wiring board 12A and the heat spreader 13A are fixed by laser welding, but other welding methods such as a resistance welding method, an ultrasonic welding method and a electromagnetic welding will give similar results as the laser welding method.

The heat spreader temporary fixing step (S3) is followed by the semiconductor chip mounting step (S4) and the wire bonding step (S5) in that order.

Figure 13:
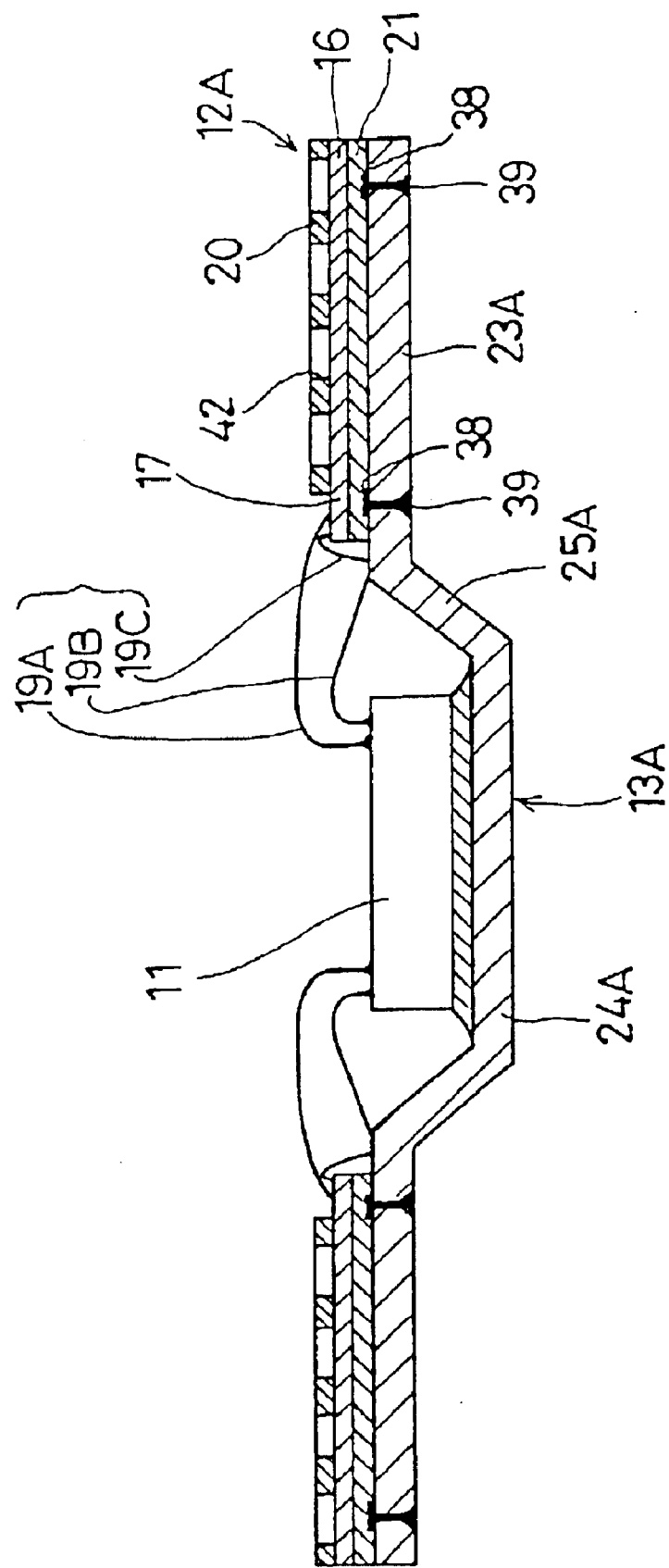
FIG. 13 is a schematic cross-sectional view of the semiconductor device illustrating a semiconductor chip mounting step and a wire bonding step of the semiconductor device producing method of the present invention.

The rim of the opening 40 is configured so as not to extend to the position facing the connecting portions 25A and the stage portion 24A of the heat spreader 13A. Therefore, the semiconductor chip 11 can be smoothly attached to the stage portion 24A, and the wires 19A to 19C can be smoothly bonded in these two steps. FIG. 13 illustrates a state after the semiconductor chip mounting step (S4) and the wire bonding step (S5).

The semiconductor mounting step (S4) and the wire bonding step (S5) are followed by the sealing resin forming step (S6). In the sealing resin forming step, the sealing resin 14A (i.e., the first sealing resin portion 26A and the second sealing resin portion 27A) is formed. In this embodiment, the sealing resin 14A is formed by a transfer molding method, for instance.

Figure 14:
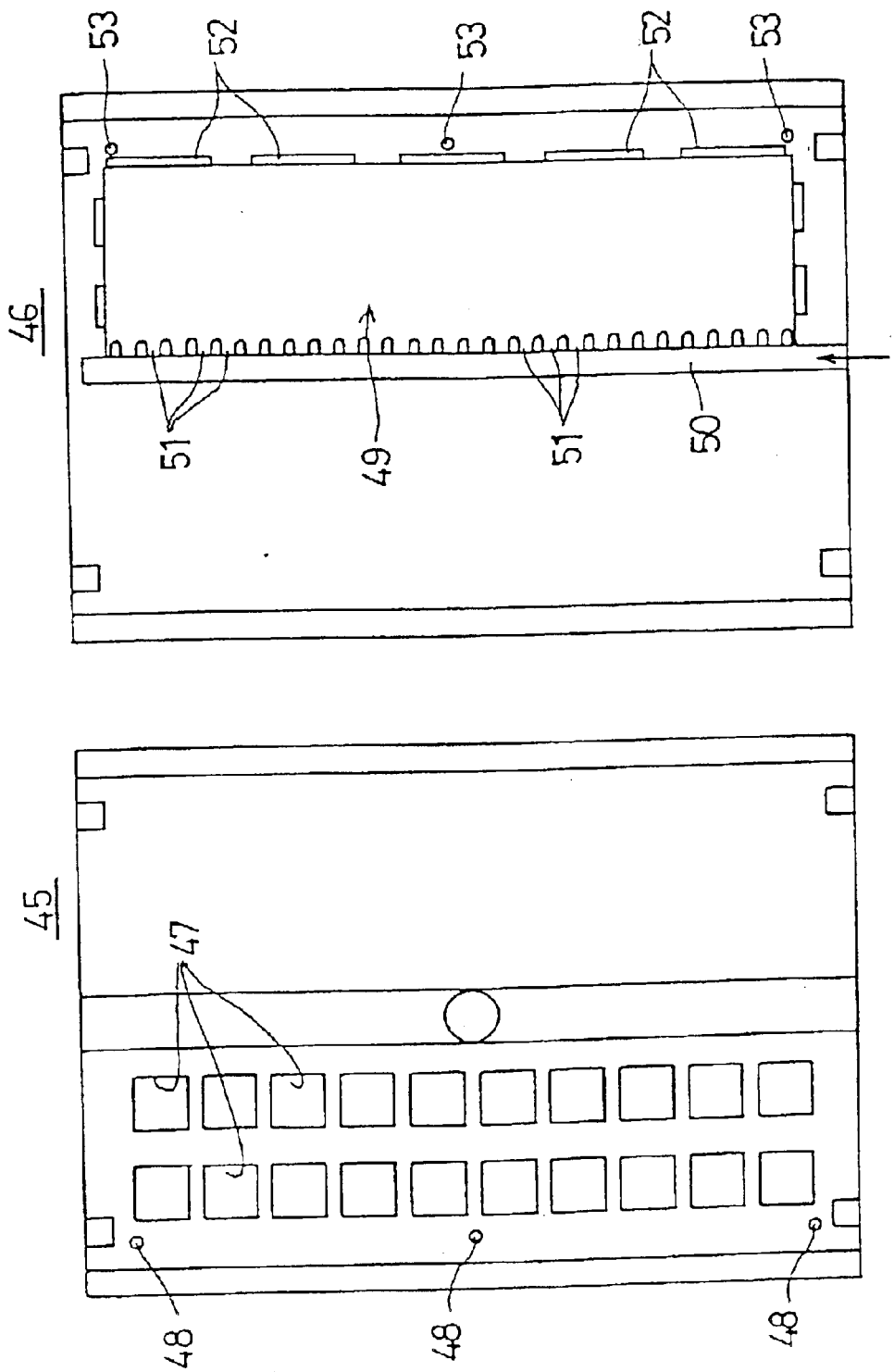
FIGS. 14A and 14B are schematic diagrams of molds used in a resin seal forming step of the semiconductor device producing method of the present invention.

FIGS. 14A and 14B illustrate a metal mold for forming the sealing resin 14A. The heat spreader 13 having the semiconductor chip 11 and the printed wiring board 12A are inserted in the metal mold so as to form the sealing resin 14A. FIG. 14A illustrates an upper mold 45, and FIG. 14B illustrates a lower mold 46.

The upper mold 45 is provided with upper cavities 47 and positioning holes 48. The upper cavities 47 face the semiconductor chip 11 when the heat spreader 13 and the printed wiring board 12A are attached to the upper mold 45. The upper cavities 47 are mainly used for forming the first sealing resin portion 26A.

The lower mold 46 is provided with a lower cavity 49, a runner 50 for filling resin, gates 51, air vents 52, and positioning pins 53 for positioning against the upper mold 45.

The lower cavity 49 is mainly used for forming the second sealing resin portion 27A, which is provided for a plurality of (twenty) heat spreaders 13A at once. The lower mold 46 has a number of gates 51 formed on the runner 50, so that resin filling can be smoothly carried out even if the lower cavity 49 has a large area (or volume).

The resin injected from an injection molding machine (not shown) is filled in the runner 50 in the direction indicated by the arrow in FIG. 11B, and the resin enters from the gates 51 into the lower cavity 49. Since each heat spreader 13A is provided with the resin filling openings 43A (shown in FIG. 5), the resin in the lower cavity 49 then enters the upper cavities 47 of the upper mold 45 through the resin filling openings 43A. Thus, the first and second sealing resin portions 26A and 27A are formed simultaneously in the sealing resin forming step.

The large-area second sealing portion 27A is collectively formed on the entire surface of the heat spreader 13 (except in the position of the stage portion 24A) in the sealing resin forming step, so that large-area molding can be carried out. Thus, the production efficiency is high, compared with the conventional structure in which the heat spreaders 13A and the printed wiring board 12A are divided in advance, and the sealing resin is formed individually. In this embodiment, the production costs can also be reduced while improving the production efficiency.

In the substrate forming step (S1) and the heat spreader forming step (S2), the heat spreaders 13A and the printed wiring boards 12A (one printed wiring board 12A corresponds to one semiconductor device 10A) are collectively formed. This also improves the production efficiency and reduces the production costs.

Figure 15:
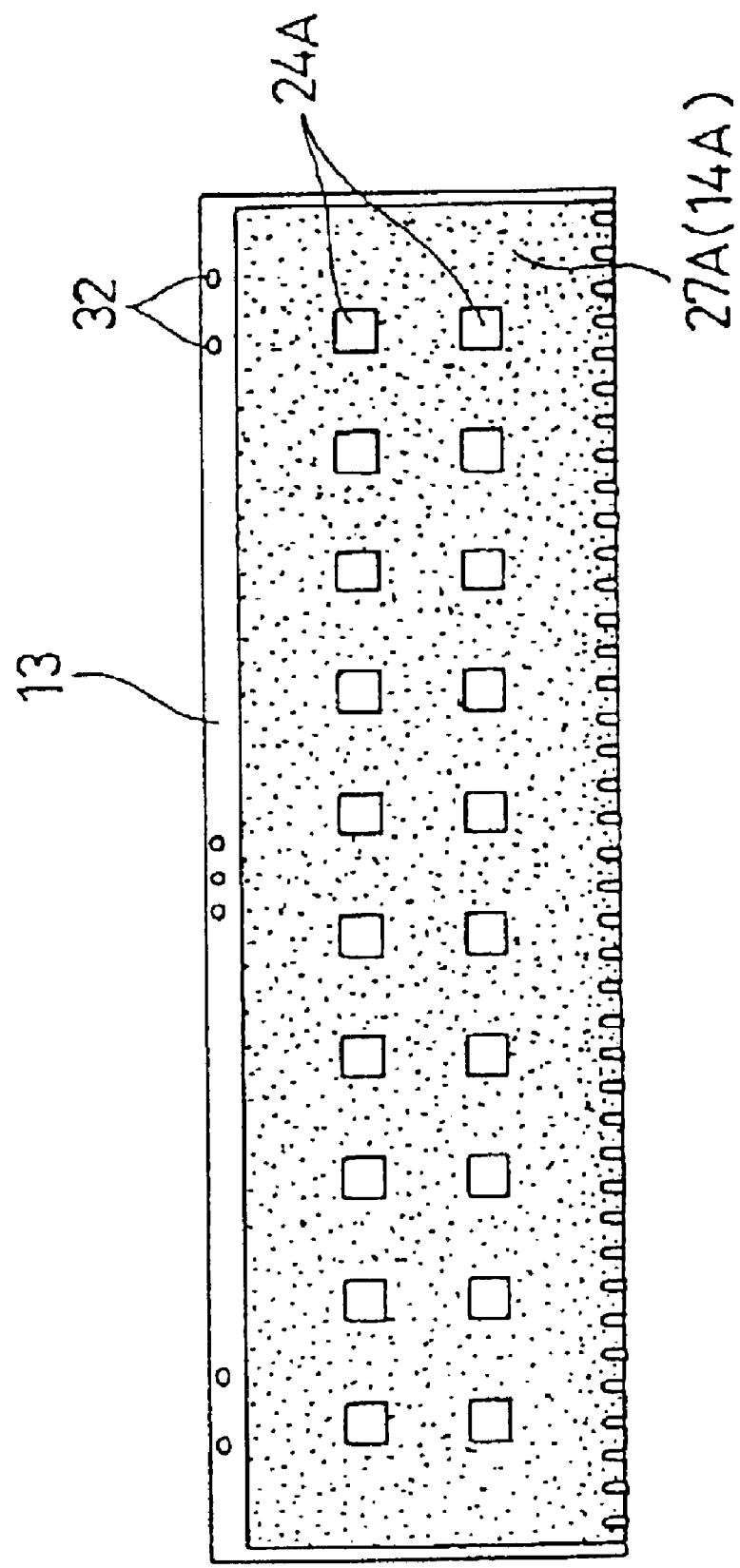
FIG. 15 is a plan view of the heat spreader collective body illustrating the sealing resin forming step of the semiconductor device producing method of the present invention.
Figure 16:
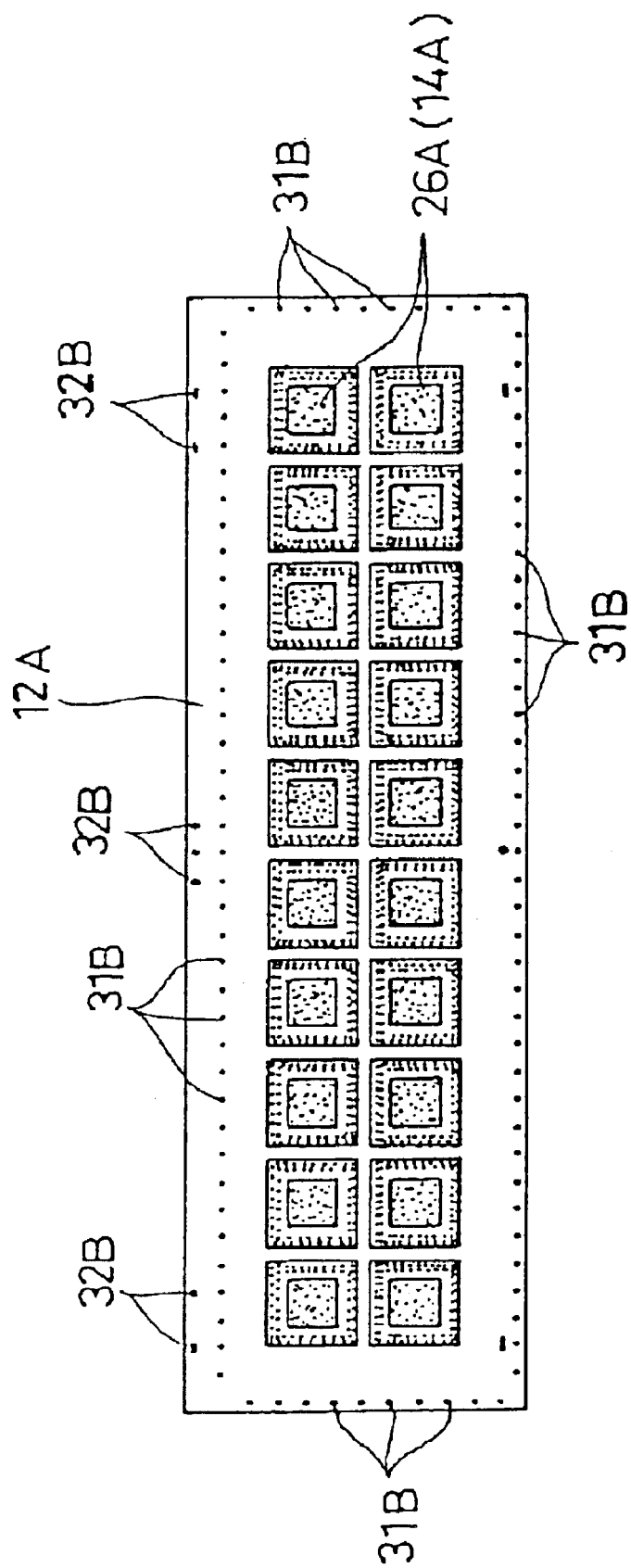
FIG. 16 is a plan view of the printed wiring board illustrating the sealing resin forming step of the semiconductor device producing method of the present invention.

FIGS. 15 and 16 illustrate the heat spreader 13 and the printed wiring board 12A after the sealing resin forming step. FIG. 15 is a view from the heat spreader 13 side, and FIG. 16 is a view from the printed wiring board 12A side.

With the sealing resin 14A, the second sealing resin portion 27A is filled in the anchor holes 33 formed in the fixed portion 34A of each heat spreader 13A, and in the anchor grooves (or the anchor holes) in the printed wiring board 12A. The anchor grooves face the anchor holes 33A.

The resin is also filled in the outer periphery anchor holes 31A (shown in FIG. 4) formed on the outer periphery of the heat spreader 13. The sealing resin 14A also functions as a fixing member for fixing the heat spreader collective body 13 onto the printed wiring board 12A. Thus, the heat spreader collective body 13 is securely fixed to the printed wiring board 12A.

After the sealing resin forming step (S6), the heat spreader 13 and the printed wiring board 12A provided with the sealing resin 14A are separated from the metal mold (45 and 46). The marking step (S7) is then carried out for providing a mark for identifying the semiconductor device 10A in a predetermined position in the sealing resin 14A. The marking step is followed by the external connection terminal arranging step (S8) is carried out for arranging the solder balls 15. The solder balls 15 are arranged on the printed wiring board 12A by a transferring method, for instance.

The external connection terminal arranging step (S8) is followed by the cutting step (S9). In this cutting step, the heat spreader 13, the printed wiring board 12A, and the sealing resin 14A are cut with a blade at the outer periphery of a corresponding semiconductor device. Thus, the semiconductor device 10A shown in FIG. 2 can be obtained.

The heat spreader collective body 13 is provided with the cutting slits 30 formed along the cutting line of the blade. The cutting slits 30 are formed even on the outer periphery of the heat spreader 13. In this manner, a load applied to the blade is reduced, and the life of the blade is prolonged.

Figure 17:
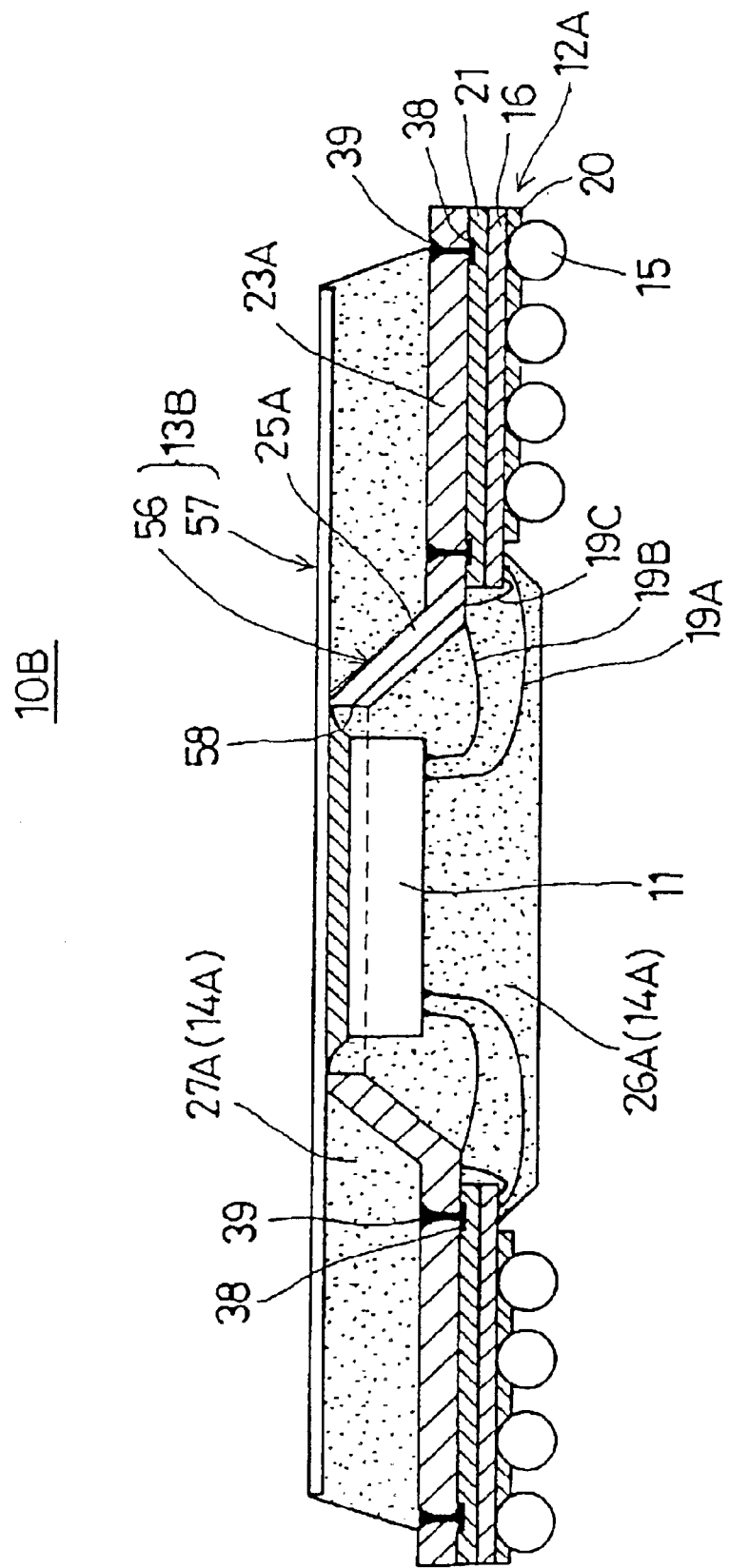
FIG. 17 is a cross-sectional diagram showing a semiconductor device of a second embodiment of the present invention.

FIG. 17 illustrates a semiconductor device 10B in accordance of the second embodiment of the present invention. In the following descriptions of the embodiments of the present invention, the same components as in the first embodiment are indicated by the same reference numerals as in the semiconductor device 10A shown in FIG. 2.

The semiconductor device 10A of the first embodiment shown in FIG. 2 is provide with the heat spreader 13A having a single plate structure. The only portion exposed from the sealing resin 14A is the stage portion 24A exposed and the connecting portion 25A and the fixed portion 23A are embedded in the sealing resin 14A. Therefore, it is only from the stage portion 24A that the heat generated from the semiconductor chip 11 is radiated. Such a structure is suitable for the semiconductor chip 11 generating a comparatively small amount of heat, but may not provide sufficient heat spreading characteristic for the semiconductor chip 11 having a comparatively large amount of heat.

Accordingly, the semiconductor device 10B of the present embodiment is characterized in that the heat spreader 13B comprises a first heat spreader portion 56 and a second heat spreader portion 57.

The first heat spreader portion 56 has a structure similar to the heat spreader 13A provided on the semiconductor device 10A of the first embodiment. That is to say, the fixed portion 23A is fixed to the printed wiring board 12A by welding the welding part 39 and the joining part 38, and is provided with the connecting portion 25A extending from the fixed portion 23A. Also, the fixed portion 23A and the connecting portion 25A are embedded in the sealing resin 14A.

The first heat spreader portion 56 differs from the heat spreader 13A provided in the semiconductor device 10A in that a central opening portion 58 is formed in the stage portion 25A. The central opening portion 58 has an area sufficient for the semiconductor chip 11 to be inserted there through.

The second heat spreader portion 57 is a flat metal plate welded to the stage portion 25A of the first heat spreader portion 56. In this manner, the first heat spreader 56 and the second heat spreader 57 are integrated to form the heat spreader 13B. Thus, the central opening portion 58 formed on the first heat spreader portion 56 is closed by the second heat spreader portion 57.

The semiconductor chip 11 is inserted through the central opening portion 58 formed in the first heat spreader portion 56 and is bonded to the second heat spreader portion 57 by the adhesive 22. As has been described above, the adhesive 22 has a high thermal conductivity. Therefore, when the semiconductor chip 11 is bonded by the adhesive 22, the semiconductor chip 11 and the second heat spreader portion 57 will be joined in a thermally connected state. Further, the second heat spreader portion 57 is provided such that its entire upper surface is exposed at the top of the sealing resin 14.

Accordingly, the heat spreading characteristic of the second heat spreader portion 57 is very high. Therefore, even with the semiconductor chip 11 generating a large amount of heat, the heat generated at the semiconductor chip 11 can be spread efficiently with the structure of the present embodiment.

Also, while the second heat spreader portion 57 is exposed from the sealing resin 14A by a large amount, the first heat spreader portion 56 welded to the second heat spreader portion 57 is embedded in the sealing resin 14A and fixed to the printed wiring board 12A. Therefore, the heat spreader 13B will not peel off from the semiconductor device 10B and can maintain a high reliability.

Figure 18:
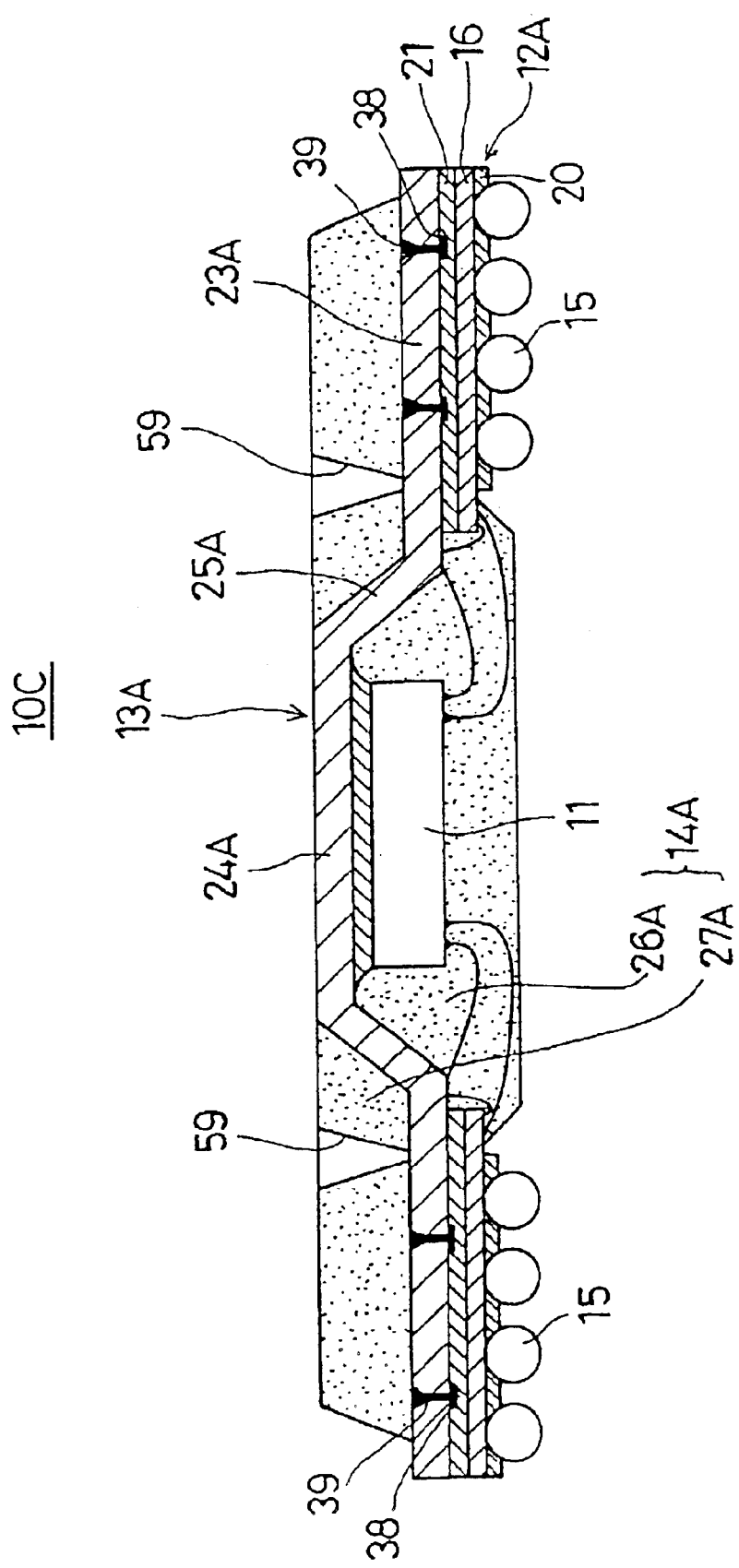
FIG. 18 is a cross-sectional diagram showing a semiconductor device of a third embodiment of the present invention.

Referring now to FIG. 18, a semiconductor device 10C of a third embodiment of the present invention will be described.

The semiconductor device 10C of the present embodiment is characterized in that vent holes 59 are formed in the second resin sealing portion 27A of the sealing resin 14A. The vent hole 59 is formed so as to reach the fixed portion 23A of the heat spreader 13A.

Through the vent holes 59, vapor generated inside the semiconductor device 10C can be released outside the semiconductor device. That is, if any water existing at the boundary of the heat spreader 13A and the sealing resin 14A is heated when the semiconductor device 10C is mounted, the water turns into vapor and its volume is increased. Without any means for releasing the vapor, a so-called popcorn crack may occur at the boundary between the heat spreader 13A and the sealing resin 14A.

With the vent holes 59 reaching the fixing part 23A being provided in the second sealing resin 27A, the vapor generated as has been described above will be released outside the semiconductor device via the vent hole 59. Thereby, the possibility of an occurrence of the popcorn crack can be reduced, and the reliability of the semiconductor device 10C can be improved.

Figure 19:
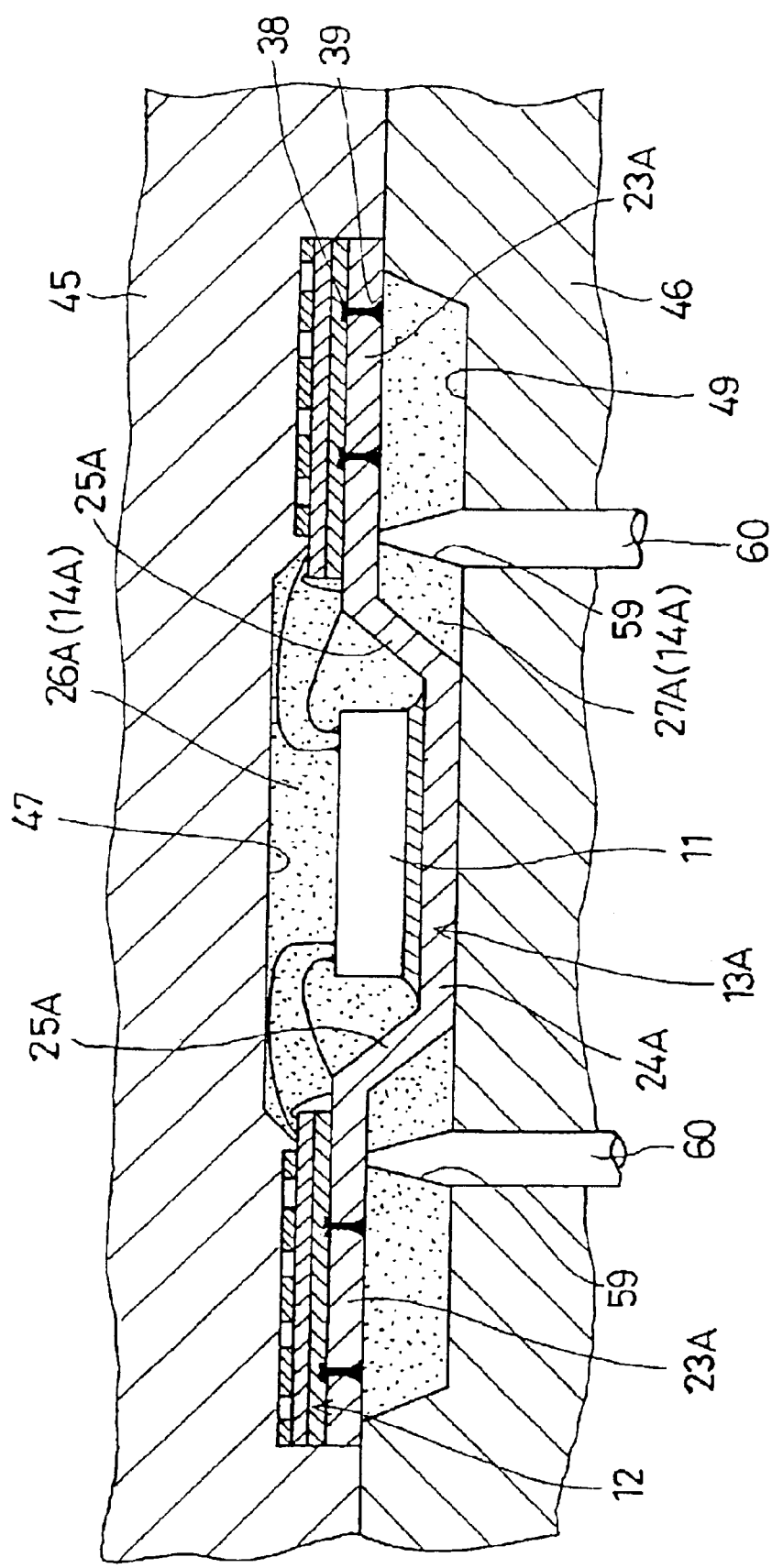
FIG. 19 is a cross-sectional diagram showing the resin sealing forming step of the semiconductor device of the third embodiment of the present invention.

FIG. 19 is a diagram showing a sealing resin forming step of the semiconductor device 10C producing process. In order to form the vent holes 59 in the second sealing resin portion 27A, the mold (lower mold 49) used in the sealing resin forming step of the present embodiment is provided with support pins 60. The support pin 60 is configured in such a manner that it can be inserted into and pulled out of the lower mold 49.

After clamping the printed wiring board 12A and the heat spreader 13A by the upper mold 45 and the lower mold 46, the support pins 60 are inserted into the lower mold 49 until it touches the fixed portion 23A of the heat spreader 13A. Then a sealing process is implemented which provides a sealing resin 14A having vent holes 59 in the second sealing resin portion 27A.

After the sealing resin forming process, the support pin 60 serves as a mold for forming the vent hole 59 while serving as a supporting member for supporting the heat spreader 13A. Thereby, the resin is prevented from being deposited onto positions other than predetermined resin sealing position (a so-called resin leaking).

In case of a double-side mold structure in which the first and second sealing resin portions 26A and 27A are formed on both sides of the heat spreader 13A, it is necessary to provide a structure for supporting the heat spreading plate inside the mold. Otherwise, the heat spreader 13A will be deformed due to a pressure exerted by injecting the resin. The deformed part may then cause resin-leaking and the resin may be formed at unwanted positions.

In the present embodiment, the support pins 60 touching the fixed portion 23A and supporting the heat spreader 13A in the cavities 47, 49 are provided, so that the support pin 60 can press the heat spreader 13A and the printed wiring board 12A towards the upper mold 45. Therefore, even if a pressure is exerted due to injection of the resin, the deformation of the heat spreader 13A can be prevented.

Thus, the resin-leaking can be prevented and the semiconductor device 10C having a high reliability can be produced. Since the support pin 60 also serves as a mold for forming the vent hole 59, the structure of the molds 45, 49 can be simplified.

Figure 20:
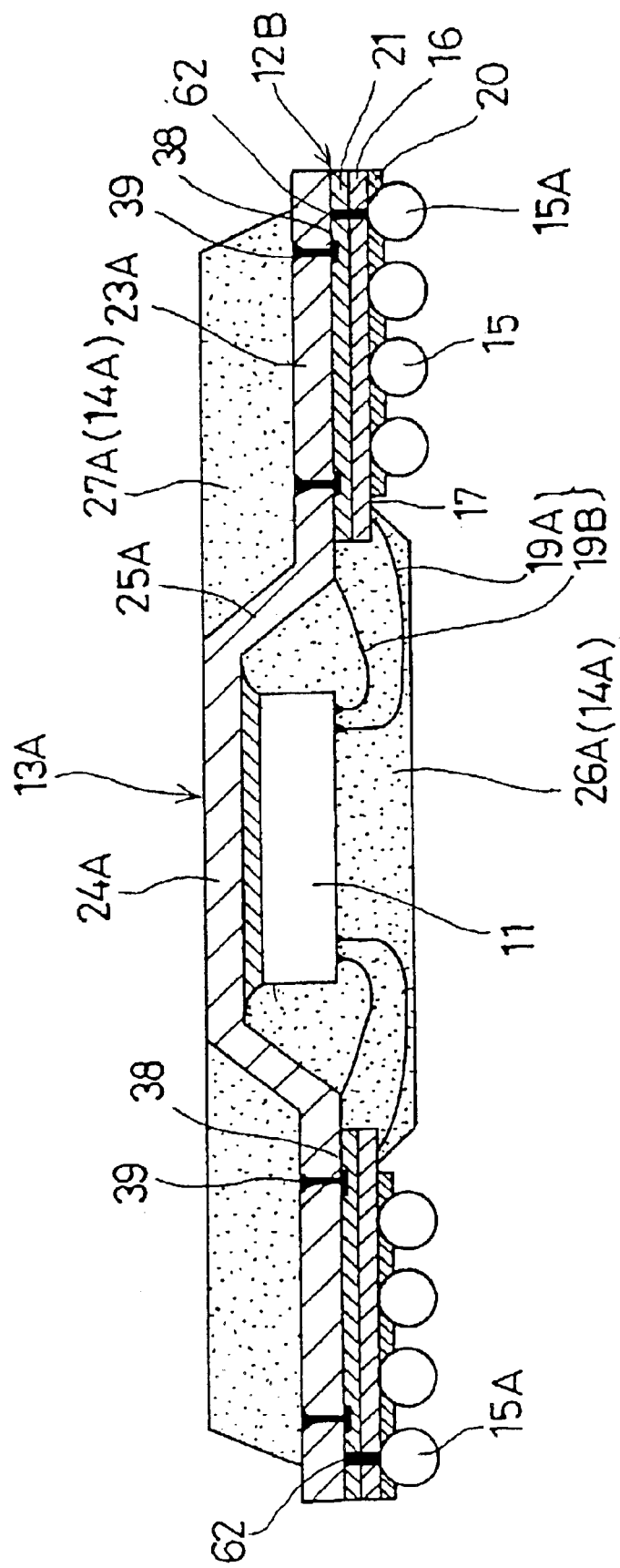
FIG. 20 is a cross-sectional diagram showing a semiconductor device of a fourth embodiment of the present invention.

Referring now to FIG. 20, a semiconductor device 10D of the fourth embodiment of the present invention will be described.

In FIG. 20, among a plurality of solder balls 15 provided on the printed wiring board 12B, the solder balls which are to be grounded when the semiconductor device is mounted are referenced as 15A. In the present embodiment, the heat spreader 13A is connected to the ground solder balls 15A by vias 62. With the structure described above, since the heat spreader 13A is made of copper (Cu) which is a conductive metal material, the heat spreader 13A will be grounded.

Accordingly, the heat spreader 13A also serves as a shielding plate which prevents any disturbance from affecting the semiconductor chip 11. Therefore, an operational reliability of the semiconductor chip 11 can be improved.

Referring again to FIG. 2 showing the semiconductor device 10A of the first embodiment, the heat spreader 13A is grounded by connecting the ground wiring layer 16 formed in the printed wiring board 12A and the heat spreader 13A using the wire 19C. However, with such a structure, inductance becomes higher due to lengthy wiring path from the grounded solder balls 15A to the heat spreader 13A, and because thin wires 19C are used. This may result in a reduction of a shielding effect by the heat spreader 13A.

In the present embodiment, inductance is reduced because the solder balls 15A and the heat spreader 13A are directly connected by the vias 62 (i.e not by wires). Thereby, the shielding effect of the heat spreader 13A is improved and the operational reliability of the semiconductor chip 11 can be improved. Further, inductance of the via 62 can be reduced by increasing the diameter of the via 62.

Figure 21:
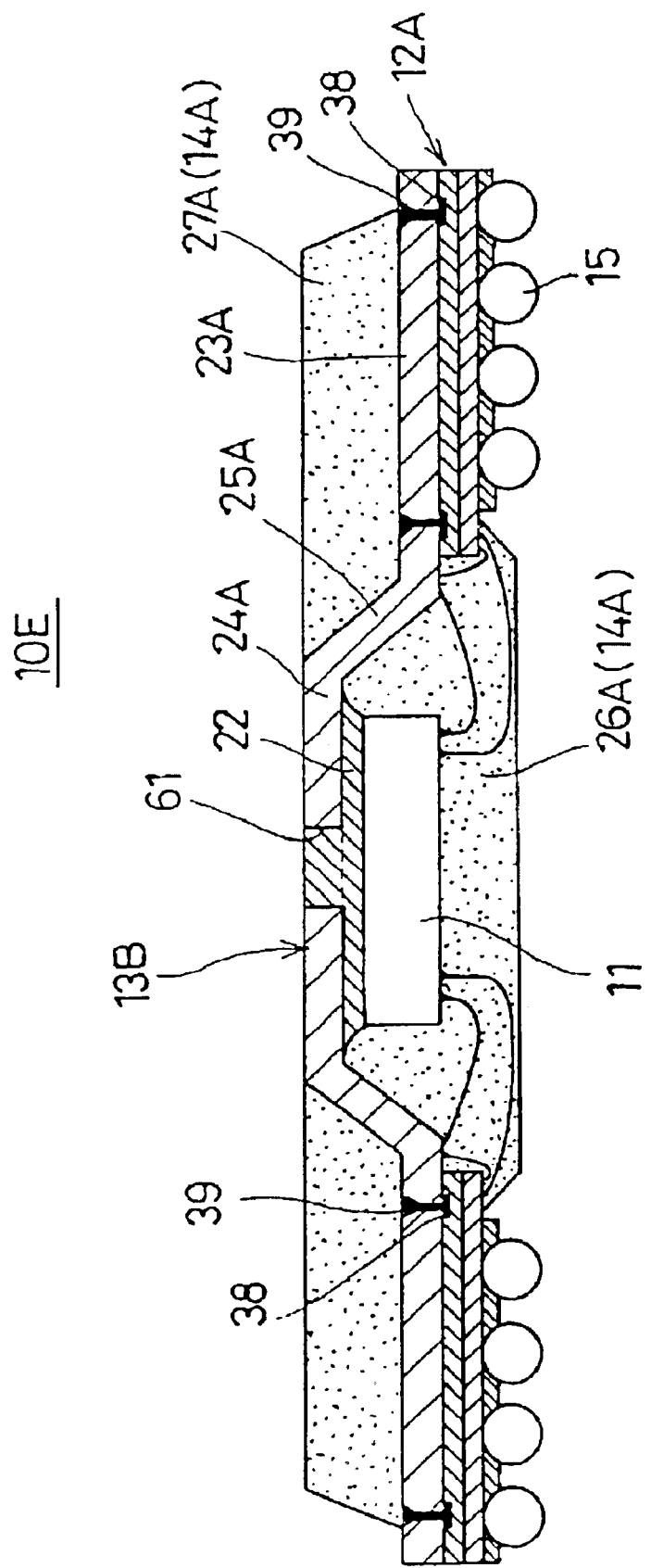
FIG. 21 is a cross-sectional diagram showing a semiconductor device of a fifth embodiment of the present invention.

Referring now to FIG. 21, a semiconductor device 10E of the fifth embodiment of the present invention will be described.

The semiconductor device 10E of the present embodiment is characterized in that the heat spreader 13B is provided with a vent hole 61 which is formed in the stage portion 24A for releasing vapor generated within the semiconductor device when the semiconductor device is mounted. In the present embodiment, there is one circular vent hole 61 formed at substantially central position of the stage portion 24A. However, the vent hole 61 may be formed at any position other than the central position of the stage 24A and the number and shape of vent holes are not limited to the structure of the present embodiment.

If there is any water within the semiconductor device (particularly within the sealing resin 14A), this water may turn into vapor due to heat applied upon mounting. With the vent hole 61 formed at the stage portion 24A exposed from the sealing resin 14A (first sealing resin portion 26A), the vapor is released outside the semiconductor device through the vent hole 62. Accordingly, even if the semiconductor device is heated, any damage such as cracks (so-called popcorn cracks) within the semiconductor device 10E can be prevented. Thus, the reliability of the semiconductor device 10E can be improved.

In the present embodiment, the semiconductor chip 11 is embedded in the vent hole 61 by the adhesive 22 fixed to the heat spreader 13B. Also, the adhesive 22 used in the present embodiment is of a type which becomes porous due to the curing process, and vapor can be released through the vent hole 61.

Also, when mounting the semiconductor chip 11 onto the stage portion 24A in the semiconductor chip mounting step (S4), the adhesive 22 may leak through the vent hole 61 formed in the stage portion 24A. This can be prevented by closing the vent hole 61 using a tape member provided on the stage portion 24A at the side opposite to the side on which the semiconductor chip 11 is mounted.

However, with the tape member being attached to the stage portion 24A, vapor generated within the semiconductor device cannot be released through the vent hole 61. Therefore, holes are formed in the tape member before heating the semiconductor device 10E (i.e., before vapor is generated). In order to form the holes in the tape member, the tape member may be melted by irradiating laser beams towards the vent hole 61 or the tape member may be destroyed by inserting a jig into the vent hole 61.

Figure 22:
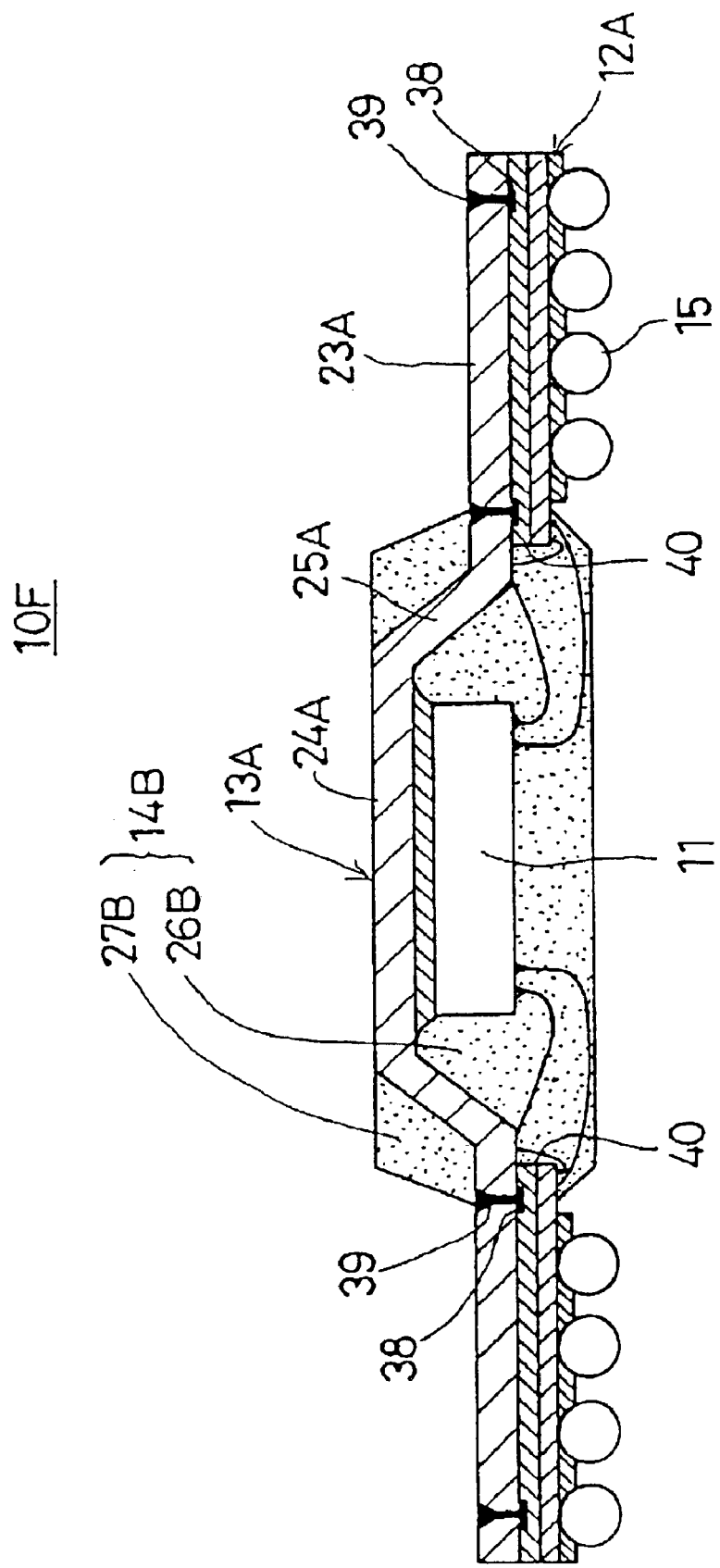
FIG. 22 is a cross-sectional diagram showing a semiconductor device of a sixth embodiment of the present invention.

Referring now to FIG. 22, a semiconductor device 10F of the sixth embodiment of the present invention will be described.

The heat spreader 13A is provided with a first sealing resin portion 26B and a second sealing resin portion 27B formed on its upper and lower sides, respectively. The semiconductor device 10F of the present embodiment is characterized in that the first and second sealing resin portions 26B, 27B are both only provided at positions near the opening 40 formed in the printed wiring board 12A. Therefore, most region of the fixed portion 23A of the heat spreader 13A is exposed. Also, the first sealing resin portion 26B and the second sealing resin portion 27B are configured so as to be substantially symmetrical about the heat spreader 13A.

With the sealing resin 14B (the first and second sealing resin portions 26B, 27B) of the above-described structure, when heat is applied to the semiconductor device 10F, heat deformations produced in the first and second sealing resin portions 26B, 27B will be substantially equal. In other words, with the structure of the present embodiment, stresses of the first and second sealing resin portions 26B, 27B on either sides of the heat spreader 13A are balanced. Therefore, the heat spreader 13A can be prevented from being warped.

Accordingly, when mounting the semiconductor device 10F on the mounting board, it is possible to prevent gaps formed between the solder balls 15 and the mounting board and to prevent cracks produced in the sealing resin 14B due to the warping of the heat spreader 13A. Also, because most region of the fixed portion 23A of the heat spreader 13A is exposed, the heat generated at the semiconductor chip 11 by the heat spreader 13A can be radiated more efficiently.

Figure 23:
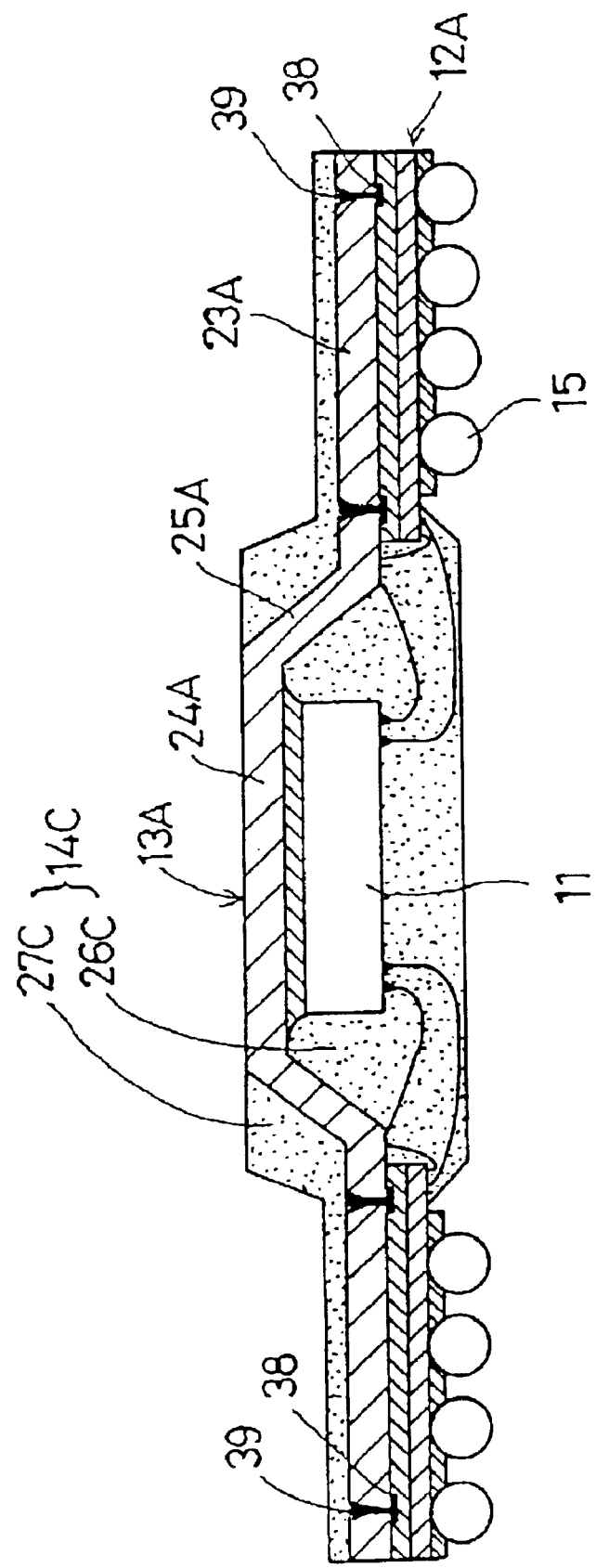
FIG. 23 is a cross-sectional diagram showing a semiconductor device of a seventh embodiment of the present invention.

Referring now to FIG. 23, a semiconductor device 10G of the seventh embodiment of the present invention will be described.

With the semiconductor device 10F of the sixth embodiment, the first and second sealing resin portions 26B, 27B are both only provided at positions near the opening 40 formed in the printed wiring board 12A. Accordingly, the stresses on the upper and lower sides of the heat spreader 13A are balanced. Such structure improves the heat spreading efficiency of the heat spreader 13A for the heat generated at the semiconductor chip 11, but reduces the strength of the printed wiring board 12A and the heat spreader 13A. Also, a bonding strength is reduced between the heat spreader 13A and the second sealing resin portion 27B.

The present embodiment is characterized in that the second sealing resin portion 27C extends to the edges of the heat spreader 13A such that the second sealing resin portion 27C covers the heat spreader 13A. However, if the entire heat spreader 13A is covered with the second sealing resin part 27C with uniform a thickness, which is the same as the thickness at the stage portion 24A, the stresses of the second and first sealing resin portions 27C, 26C will be unbalanced. In order to prevent this, the second sealing resin portion 27C is configured such that its thickness is reduced at portions opposing the fixed portion 23A of the heat spreader 13A.

According to the structure of the present embodiment, since the second sealing resin portion 27C extends to the edges of the heat spreader 13A, the bonding between the heat spreader 13A and the second sealing resin portion 27C can be improved. Also, because the second sealing resin portion 27C also serves as a reinforcement of the printed wiring board 12A and the heat spreader 13A, the mounting resistance and the reliability of the semiconductor device 10G upon mounting can be improved.

Referring now to FIG. 24, a semiconductor device 10G of the seventh embodiment of the present invention will be described.

The semiconductor device 10H of the present embodiment is characterized in that a multi-layer printed wiring board 63A is used as a substrate. The multi-layer printed wiring board 63A used in the present embodiment includes first to third insulting layers 65A to 65C and two wiring layers disposed between the insulating layers 65A to 65C. The wiring layers comprises a ground wiring layer 64A (hereinafter referred to as a GND wiring layer), a source wiring layer 64B and a signal wiring layer 64C. In the following description, one side of the multi-layer wiring board 63 opposing the heat spreader 13A is referred to as an upper side. The other side of the multi-layer wiring board 63 on which the solder balls 15A to 15C are provided is referred to as a lower side.

The solder balls 15A to be grounded when mounted are connected to a lower ground wiring layer 64A. The lower ground wiring layer 64A is connected to the heat spreader 13A via an upper ground wiring layer 64A, the joining parts 38 and the welding parts 39. Thereby, the heat spreader 13A is grounded and serves as a shielding plate. Also, the heat spreader 13A is connected to ground electrodes of the semiconductor chip 11 by the wires 19C.

The solder balls 15B to be connected to power supply when mounted are connected to a lower source wiring layer 64B. The lower source wiring layer 64B is connected to an upper source wiring layer 64B by the via 62B and is connected to the lower source wiring layer 64B near the opening 40 by the via 62C. The source wiring layer 64B near the opening 40 is connected to the power supply electrode of the semiconductor chip 11 by the wire 19B.

The solder balls 15C for signal input when mounted are connected to a lower signal wiring layer 64C. The signal wiring layer 64C is connected to signal electrodes of the semiconductor chip 11 by the wire 19A.

When the multi-layer printed wiring board 63A is used as a substrate, the degree of freedom of a layout of the wiring layers 64A to 64C can be improved and the pitch between the wiring layers 64A to 64C can be narrowed. Thereby, the present embodiment is applicable to the semiconductor chip 11 with high-density structure.

Also, in the present embodiment, the grounded heat spreader 13A and the upper source wiring layer 64B opposes each other with the insulating layer 65A being placed between them. This results in an increased decoupling capacity between the heat spreader 13A (GND wiring) and the source wiring layer 64B. Thus, the semiconductor device 10H having good electric characteristic (particularly, high frequency characteristic) can be obtained. Similar effect can be obtained by connecting the heat spreader 13A to the power supply and grounding the upper source wiring layer 64B, such that the upper source wiring layer 64B serves as the GND wiring layer.

Referring now to FIG. 25, a semiconductor device 10I of the ninth embodiment of the present invention will be described. In the following descriptions of FIG. 25, the same components as in the eighth embodiment are indicated by the same reference numerals as in the semiconductor device 10H shown in FIG. 8.

With the semiconductor device 10H of the eighth embodiment, the wiring layers 64A, 64B are connected by means of vias 62A to 62C. Whereas with the semiconductor device 10I of the present embodiment, inter-layer connection wiring parts 66 (hereinafter referred to as inter-layer connecting parts) are formed at the edges of a multi-layer printed wiring board 63B. The present embodiment is characterized in that the wiring layers 64A, 64B are connected by means of the inter-layer connection parts 66.

Since the inter-layer connecting parts 66 are formed at the edges of the multi-layer printed wiring board 63B, the inter-layer connecting parts 66 can be formed with a greater area than the vias 62A to 62C formed at inner position of the multi-layer printed wiring board 63A. Thus, according to the present embodiment, the inductance can be reduced. Therefore, the semiconductor device 10I having good electric characteristic (particularly, high frequency characteristic) can be obtained, and the electric characteristic of the semiconductor device 10I can be further increased.

Referring now to FIG. 26, a semiconductor device 10J of the tenth embodiment of the present invention will be described.

The semiconductor device 10A of the first embodiment shown in FIG. 2 comprises the printed wiring board 12A serving as a substrate. Whereas the semiconductor device 10J of the present embodiment is characterized in that a TAB (Tape Automated Bonding) board 67 is used as a substrate.

The TAB board 67 comprises a tape base material 68 made of polyimide (PI) and the wiring layer 16 made of copper film, as in the printed wiring board 12A. The TAB board 67 enables finer processing of the wiring layer 16 compared to the printed wiring board 12A.

Therefore, by employing the TAB board 67 as a substrate, the semiconductor device can be used with a high-density semiconductor chip 11. Also, because the thickness of the TAB board 67 is smaller than the thickness of the printed wiring board 12A, the thickness of the semiconductor device 10J can be reduced. The design rule may be, for example expressed by line-and-space(L/S), L/S=30/30 $\mu$m.

Further, the present invention is not limited to these embodiments, but variations and modifications may be made without departing from the scope of the present invention.

The present application is based on Japanese priority application No. 11-353727 filed on Dec. 13, 1999, the entire contents of which are hereby incorporated by reference.

What is claimed is:

1. A method of producing a semiconductor device comprising the steps of:

a) forming a substrate provided with an opening formed at a substantially central position, interconnections and joining parts, one end of one of said interconnections being provided with an external connection terminal and the other end of said one of said interconnections being electrically connected to a semiconductor chip;

b) forming a heat spreading plate having a fixed portion fixed to said substrate, a stage portion caved with respect to said fixed potion and connecting portions connecting said fixed portion and said stage portion;

c) fixing said heat spreading plate by positioning said stage portion at a position opposing said opening and then welding said heat spreading plate to said substrate;

d) mounting said semiconductor chip on said stage portion through said opening;

e) electrically connecting said semiconductor chip and said interconnections formed on said substrate; and f) forming sealing resin on both sides of said heat spreading plate such that said semiconductor chip is sealed.

2. The method as claimed in claim 1, wherein said step f) is implemented using molds for forming said sealing resin, said molds being provided with supporting members to touch said fixed portion of said heat spreading plate and said molds holding said heat spreading plate within cavities formed in the molds.

3. The method as claimed in claim 2, wherein in said step c), said welding is performed by one of selected from the group consisting of laser welding method, resistance welding method, ultrasound welding method and a welding method using electromagnetic wave.

* * * * *